United States Patent
Kim et al.

(10) Patent No.: US 11,880,520 B2
(45) Date of Patent: Jan. 23, 2024

(54) DISPLAY DEVICE

(71) Applicant: SAMSUNG DISPLAY CO., LTD., Yongin-si (KR)

(72) Inventors: Hyung Bae Kim, Hwaseong-si (KR); Tae Joon Kim, Seongnam-si (KR); Jae Woo Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 23 days.

(21) Appl. No.: 17/403,100

(22) Filed: Aug. 16, 2021

(65) Prior Publication Data

US 2022/0164047 A1  May 26, 2022

(30) Foreign Application Priority Data

Nov. 26, 2020 (KR) .................. 10-2020-0160864

(51) Int. Cl.
*G06F 3/041* (2006.01)
*G06F 3/044* (2006.01)
*H10K 59/40* (2023.01)
*H10K 59/179* (2023.01)

(52) U.S. Cl.
CPC .......... *G06F 3/0412* (2013.01); *G06F 3/0446* (2019.05); *H10K 59/1795* (2023.02); *H10K 59/40* (2023.02)

(58) Field of Classification Search
None
See application file for complete search history.

(56) References Cited

U.S. PATENT DOCUMENTS

| | | | |
|---|---|---|---|
| 11,340,737 B2 * | 5/2022 | Hu | G06F 3/044 |
| 2017/0278900 A1 * | 9/2017 | Yang | G06F 1/1652 |

FOREIGN PATENT DOCUMENTS

| | | |
|---|---|---|
| KR | 10-1699530 | 1/2017 |
| KR | 10-2019-0025798 | 3/2019 |
| KR | 10-2021-0145877 | 12/2021 |

\* cited by examiner

*Primary Examiner* — Brian M Butcher
(74) *Attorney, Agent, or Firm* — F. CHAU & ASSOCIATES, LLC

(57) ABSTRACT

A touch member for a display device includes first and second touch signal lines and an insulating layer between first and second conductive layers. The first touch signal line includes a first sub-touch signal line corresponding to the first conductive layer, and a second sub-touch signal line corresponding to the second conductive layer and connected to the first sub-touch signal line through first and second contact holes penetrating the insulating layer. The second touch signal line includes a third sub-touch signal line corresponding to the first conductive layer, and a fourth sub-touch signal line corresponding to the second conductive layer and connected to the third sub-touch signal line through third and fourth contact holes penetrating the insulating layer. The first and second contact holes are spaced by a first distance, and the third and fourth contact holes are spaced by a second distance less than the first distance.

20 Claims, 14 Drawing Sheets

DISPLAY DEVICE

This application claims priority from Korean Patent Application No. 10-2020-0160864, filed on Nov. 26, 2020, in the Korean Intellectual Property Office and all the benefits accruing therefrom under 35 U.S.C. 119, the contents of which in its entirety are herein incorporated by reference.

BACKGROUND

1. Field of the Disclosure

One or more embodiments described herein relate to a display device.

2. Description of the Related Art

A variety of displays have been incorporated into smart phones, digital cameras, laptop computers, navigation devices, and smart televisions as well as other devices. Examples include liquid-crystal displays, field emission displays, organic light-emitting displays, inorganic light-emitting displays, and micro-light-emitting displays. Some displays have a touch panel that receives instructions or other forms of input for purposes of performing corresponding functions.

SUMMARY

One or more embodiments provide a display device including a touch member that can improve uniformity of touch sensitivity and can suppress or prevent defects caused by particles. It should be noted that features of the present disclosure are not limited to the above-mentioned features; and other features of the present disclosure will be apparent to those skilled in the art from the following descriptions.

In accordance with one or more embodiments, a display device includes a display panel and a touch member comprising a first conductive layer and a second conductive layer disposed on the display panel, and a touch insulating layer interposed between the first conductive layer and the second conductive layer. The touch member includes a first touch signal line and a second touch signal line separated from each other, the first touch signal line including a first sub-touch signal line formed as the first conductive layer and a second sub-touch signal line formed as the second conductive layer and connected to the first sub-touch signal line through a first contact hole and a second contact hole penetrating the touch insulating layer. The second touch signal line includes a third sub-touch signal line formed as the first conductive layer and a fourth sub-touch signal line formed as the second conductive layer and connected to the third sub-touch signal line through a third contact hole and a fourth contact hole penetrating the touch insulating layer. The first contact hole and the second contact hole are spaced apart from each other by a first distance, and the third contact hole and the fourth contact hole are spaced apart from each other by a second distance less than the first distance.

In accordance with one or more embodiments, a display device includes a display panel and a touch member disposed on the display panel and comprising a first touch sensing line comprising a first sub-touch sensing line and a second sub-touch sensing line, and a second touch sensing line comprising a third sub-touch sensing line and a fourth sub-touch sensing line. The first sub-touch sensing line and the second sub-touch sensing line are connected in parallel with each other through a first contact hole and a second contact hole. The third sub-touch sensing line and the fourth sub-touch sensing line are connected in parallel with each other through a third contact and a fourth contact hole. A length of the first touch sensing line is longer than a length of the second touch sensing line, and a distance between the first contact hole and the second contact hole is greater than a distance between the third contact hole and the fourth contact hole.

BRIEF DESCRIPTION OF THE DRAWINGS

The above and other aspects and features will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention.

It will also be understood that when a layer is referred to as being "on" another layer or substrate, it can be directly on the other layer or substrate, or intervening layers may also be present. Like numbers indicate like components throughout the specification. In the attached figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments of the present disclosure will be described with reference to the accompanying drawings.

Figure 1:
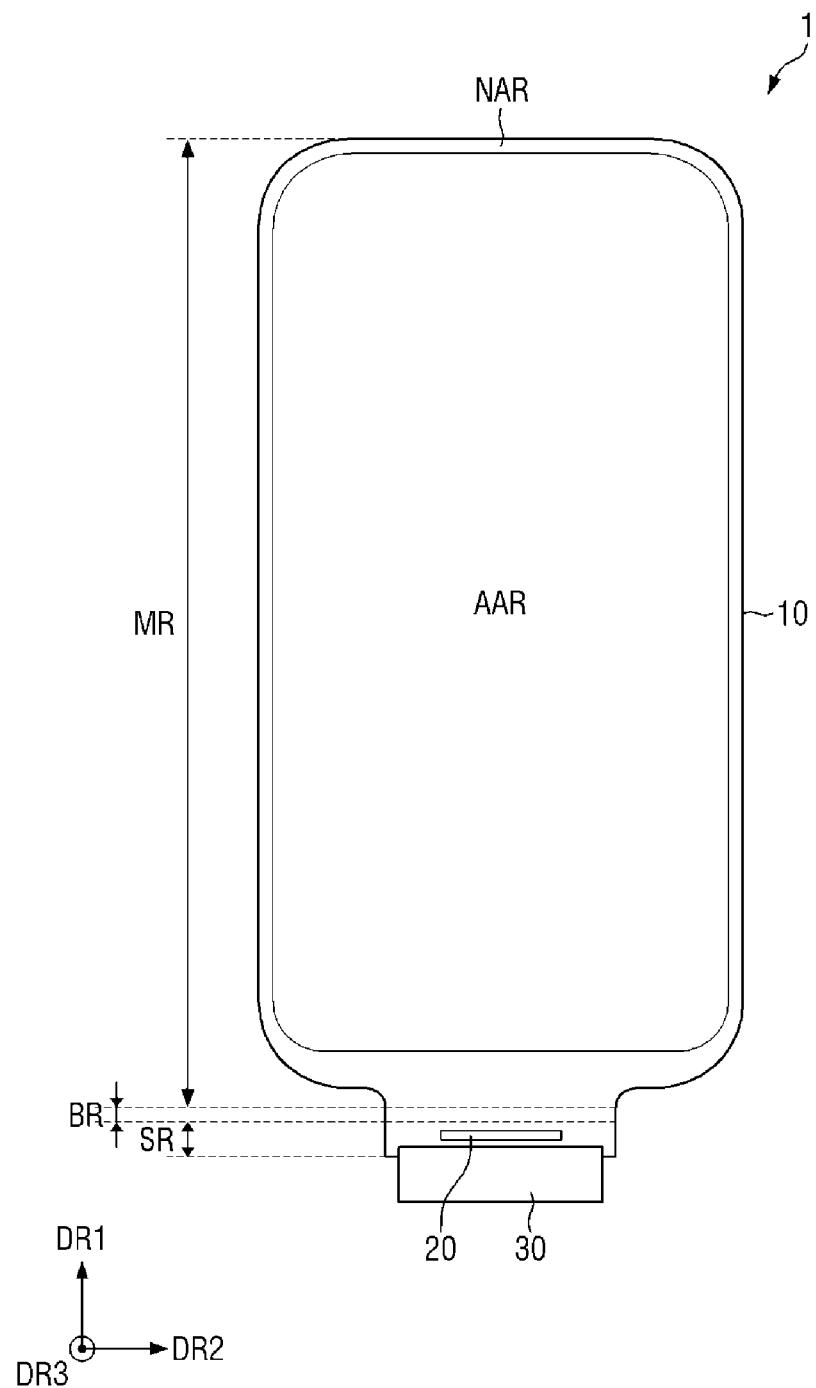
FIG. 1 illustrates an embodiment of a display device.
Figure 2:
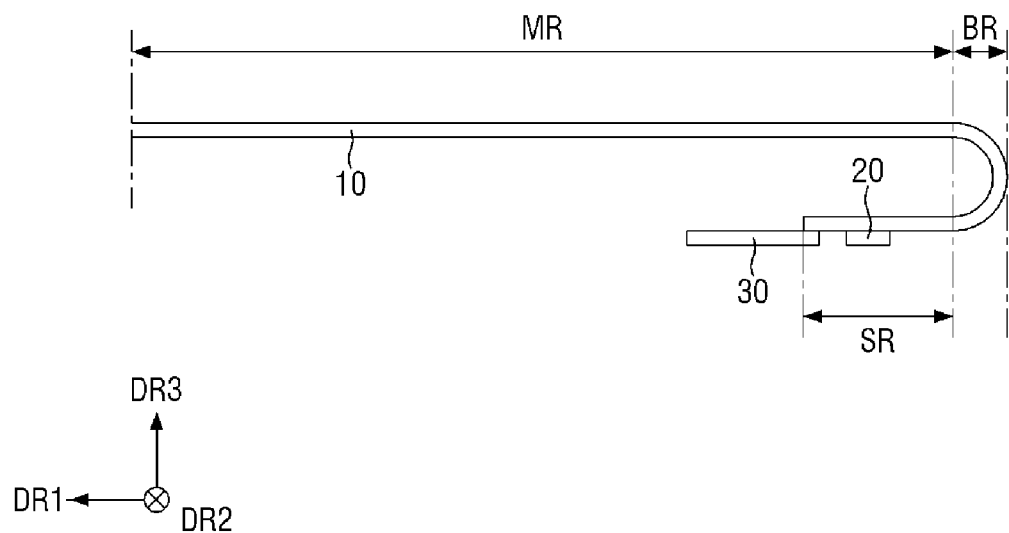
FIG. 2 illustrates a cross-sectional embodiment of a display device.

FIG. 1 is a plan view showing the layout of a display device 1 according to an embodiment, and FIG. 2 is a cross-sectional view of a part of the display device 1 according to an embodiment.

In these embodiments, the first direction DR1 may intersect the second direction DR2. In the plan view of FIG. 1, the first direction DR1 corresponds to the vertical direction and the second direction DR2 corresponds to the horizontal direction for convenience of illustration. In the following description, a first side of the first direction DR1 indicates the upper side, a second side of the first direction DR1 indicates the lower side, a first side of the second direction DR2 indicates the right side, and a second side of the second direction DR2 indicates the left side when viewed from the top. A third direction DR3 refers to a direction that crosses the plane where the first direction DR1 and the second direction DR2 are located, and the third direction DR3 is perpendicular to both the first direction DR1 and the second direction DR2. It should be understood that the directions referred with respect to the embodiments are relative directions, and the embodiments are not limited to the directions mentioned.

As used herein, the terms "top", "upper surface" and "upper side" in the third direction DR3 refer to the display side of a display panel 10, and the terms "bottom", "lower surface" and "lower" refer to the opposite side of the display panel 10, unless stated otherwise.

Referring to FIGS. 1 and 2, display device 1 may correspond to any type of electronic device providing a display screen. Examples of display device 1 include a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console and a digital camera, a television set, a laptop computer, a monitor, an electronic billboard, the Internet of Things devices, etc.

The display device 1 includes an active area AAR and a non-active area NAR. In the display device 1, a display area may be an area where images are displayed and a non-display area may be an area where no image is displayed. A touch area may be an area where a touch input is sensed. The display area and the touch area may be in the active area AAR. The display area and the touch area may overlap each other, e.g., images are displayed and touch inputs are sensed in the active area AAR.

The active area AAR may have a predetermined shape, e.g., a rectangle or a rectangle with rounded corners. In the example shown, the shape of the active area AAR is a rectangle that has rounded corners, with sides extending in the first direction DR1 that are longer than the sides extending in the second direction DR2. The active area AAR may have a different shape in another embodiment. Examples include a rectangular shape with sides in the second direction DR2 longer than sides in the first direction DR1, a square shape, other polygonal shapes, a circular shape, and an elliptical shape.

The non-active area NAR is around the active area AAR and may correspond to a bezel area. The non-active area NAR may surround all or some sides (four sides in the drawings) of the active area AAR. It is, however, to be understood that the present disclosure is not limited thereto. For example, the non-active area NAR may not be disposed near the upper side of the active region AAR or near the left or right side thereof.

Signal lines and/or driving circuits may be disposed in the non-active area NAR for applying or generating signals for the active area AAR (display area or touch area). The non-active area NAR may include no display area. Further, the non-active area NAR may include no touch area. In another embodiment, the non-active area NAR may include a part of the touch area, and a sensor member such as a pressure sensor may be disposed in that part. In some embodiments, the active area AAR may correspond to the display area where images are displayed, while the non-active area NAR may be correspond to the non-display area where no image is displayed.

The display device 1 includes a display panel 10 for providing a display screen. Examples of the display panel 10 include an organic light-emitting display panel, a micro LED display panel, a nano LED display panel, a quantum-dot display panel, a liquid-crystal display panel, a plasma display panel, a field emission display panel, an electrophoretic display panel, an electrowetting display panel, etc. In the following description, an organic light-emitting display panel is employed as an example of the display panel 10, but the present disclosure is not limited thereto. A different type of display panel may be employed in another embodiment.

The display panel 10 includes a plurality of pixels arranged, for example, in a matrix. The shape of each pixel may be, but is not limited to, a rectangle or a square when viewed from the top. In one embodiment, each pixel may have a diamond shape having sides inclined with respect to the first direction DR1 or the second direction DR2. Each pixel may include an emission area, which may have a shape which is substantially the same as or different from the shape of the pixels. For example, when the pixels have a rectangular shape, the shape of the emission area of each pixel may be a rectangle or may be a different shape, e.g., a diamond, a hexagon, an octagon, or a circle. Embodiments of the pixels and emission areas will be described in detail later.

The display device 1 may further include a touch member for sensing a touch input. The touch member may be implemented, for example, as a panel or film separated from and coupled to the display panel 10 or may be implemented to include a touch layer inside the display panel 10. In the following description, for illustrative purposes, the touch member is provided inside the touch panel to be included in the display panel 10. However, the touch member may be provided in a different arrangement in another embodiment.

The display panel 10 may include a flexible substrate including a flexible polymer material such as polyimide. Accordingly, the display panel 10 may be curved, bent, folded, and/or rolled. In one embodiment, the display panel 10 may include a bending region BR, and may be divided into a main region MR located on one side of the bending region BR and a subsidiary region SR located on another side of the bending region BR.

The display area of the display panel 10 is located in the main region MR. According to an embodiment, edge portions of the display area in the main region MR, all or part of the bending region BR and all or part of the subsidiary region SR may be the non-display area. It is, however, to be understood that the present disclosure is not limited thereto. For example, the bending region BR and/or the subsidiary region SR may also include the display area.

The main region MR may have a shape generally similar to the appearance of the display device 1 when viewed from the top. The main region MR may be a flat region located in one plane. It is, however, to be understood that the present disclosure is not limited thereto. At least one of the edges of the main region MR, except for the edge (side) connected to the bending region BR, may be bent to form a curved surface or may be bent at a right angle.

When at least one of the edges of the main region MR, except for the edge (side) connected to the bending region BR, is curved or bent, the display area may also be disposed at the edge. It is, however, to be understood that the present disclosure is not limited thereto. The curved or bent edge may be the non-display area that does not display an image or the display area and the non-display area may be disposed together.

The bending region BR is connected to the other side of the main region MR in the first direction DR1. For example, the bending region BR may be connected to the lower shorter side of the main region MR. The width of the bending region BR may be less than the width (width of the shorter side) of the main region MR. The portions where the main region MR meets the bending region BR may be cut in an L-shape.

In the bending region BR, the display panel 10 may be bent downward in the thickness direction, e.g., in the direction away from the display surface with a curvature. The bending region BR may have a constant radius of curvature or may have different radii of curvature for different sections. As the display panel 10 is bent at the bending region BR, the surface of the display panel 10 may be reversed. For example, the surface of the display panel 10 facing upward may be bent to face outwardly at the bending region BR and then to face downwardly.

The subsidiary region SR is extended from the bending region BR and, for example, may extend in a direction parallel to the main region MR from the end of the bending region. The sub region SR may overlap with the main region MR in the thickness direction of the display panel 10. The width of the subsidiary region SR (the width in the second direction DR2) may be, but is not limited to being, equal to the width of the bending region BR.

A driver chip IC may be disposed in the subsidiary region SR and may include an integrated circuit for driving the display panel 10. The integrated circuit may include an integrated circuit for display and/or an integrated circuit for a touch unit. The integrated circuit for a display and the integrated circuit for a touch unit may be provided as separate chips or may be integrated into a single chip.

The pads may be disposed at the end of the subsidiary region SR of the display panel 10. The pads may include display signal line pads and touch signal line pads. A drive substrate FPC may be connected to the pads at the end of the subsidiary region SR of the display panel 10. The drive substrate FPC may be a flexible printed circuit (FPC) board or a film.

Figure 3:
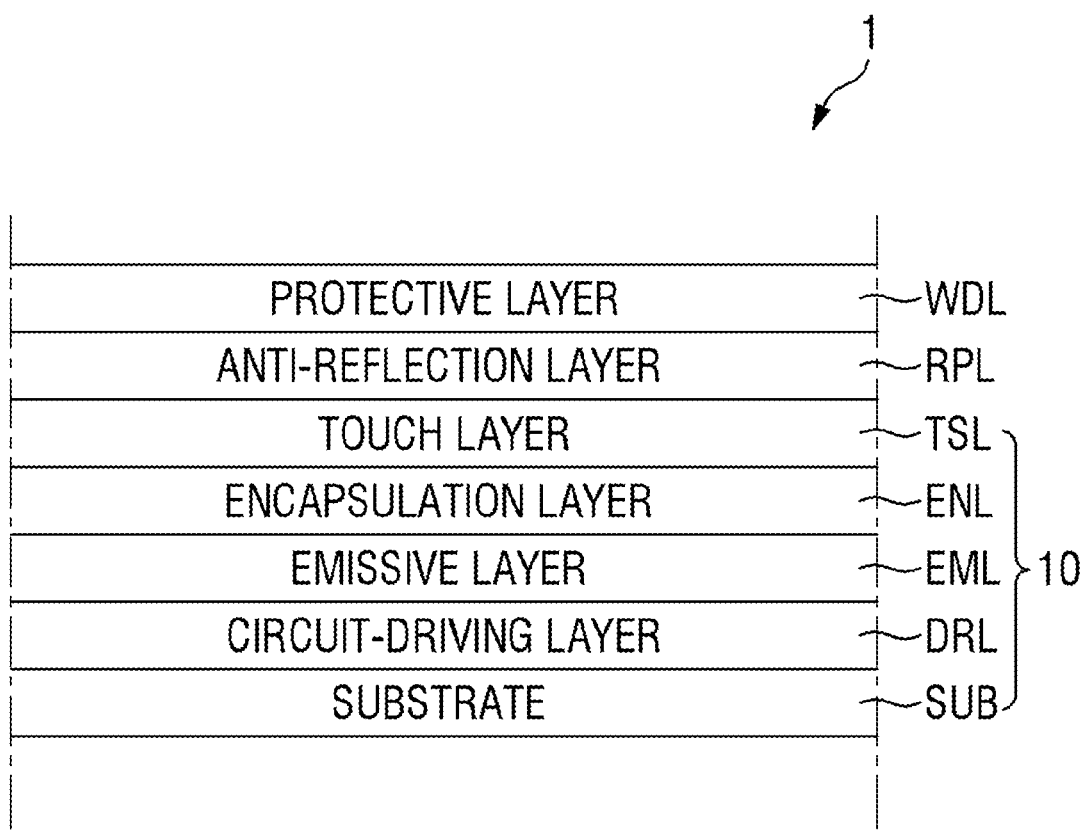
FIG. 3 illustrates an example of a stack structure of a display panel.

FIG. 3 is a cross-sectional view showing an example of a stack structure of the display panel 10 according to an embodiment.

Referring to FIG. 3, the display device 1 may include the display panel 10, an anti-reflection layer RPL, and a protective layer WDL, which are stacked on one another. The display panel 10 may include a substrate SUB, a circuit driving layer DRL, an emissive layer EML, an encapsulation layer ENL, and a touch layer TSL, which are stacked on one another.

The substrate SUB may support elements disposed thereon.

The circuit-driving layer DRL may be disposed on the substrate SUB and may include a circuit for driving an emissive layer EML of each pixel. The circuit-driving layer DRL may include a plurality of thin-film transistors.

The emissive layer EML may be disposed on the circuit-driving layer DRL and may include an organic emitting layer. The emissive layer EML may emit light with various luminances depending on driving signals transmitted from the circuit-driving layer DRL.

The encapsulation layer ENL may be disposed on the emissive layer EML and may include an inorganic layer or a stack of an inorganic layer and an organic layer. As another example, glass or an encapsulation film may be employed as the encapsulation layer ENL.

A touch layer TSL may be disposed on the encapsulation layer ENL and may sense a touch input and perform functions of the touch member. The touch layer TSL may include a plurality of sensing regions and sensing electrodes.

The anti-reflection layer RPL may be disposed on the touch layer TSL and may serve to reduce reflection of external light. The anti-reflection layer RPL may be attached in the form of a polarizing film. In such case, the anti-reflection layer RPL may polarize the light passing through it, and, for example, may be attached on the touch layer TSL through an adhesive layer. The anti-reflection layer RPL in the form of a polarizing film may be eliminated. The anti-reflection layer RPL may serve to reduce reflection of external light. It is, however, to be understood that the present disclosure is not limited thereto. I one embodiment, the anti-reflection layer RPL may be stacked in the form of a color filter layer inside the display panel 10. In such case, the anti-reflection layer RPL may include a color filter that selectively transmits light of a particular wavelength, etc.

The protective layer WDL may be disposed on the anti-reflection layer RPL and may include, for example, a window member. The protective layer WDL may be attached on the anti-reflection layer RPL by an optically clear adhesive or the like. An embodiment of the stack structure of display panel 10 will be described in more detail later.

Figure 4:
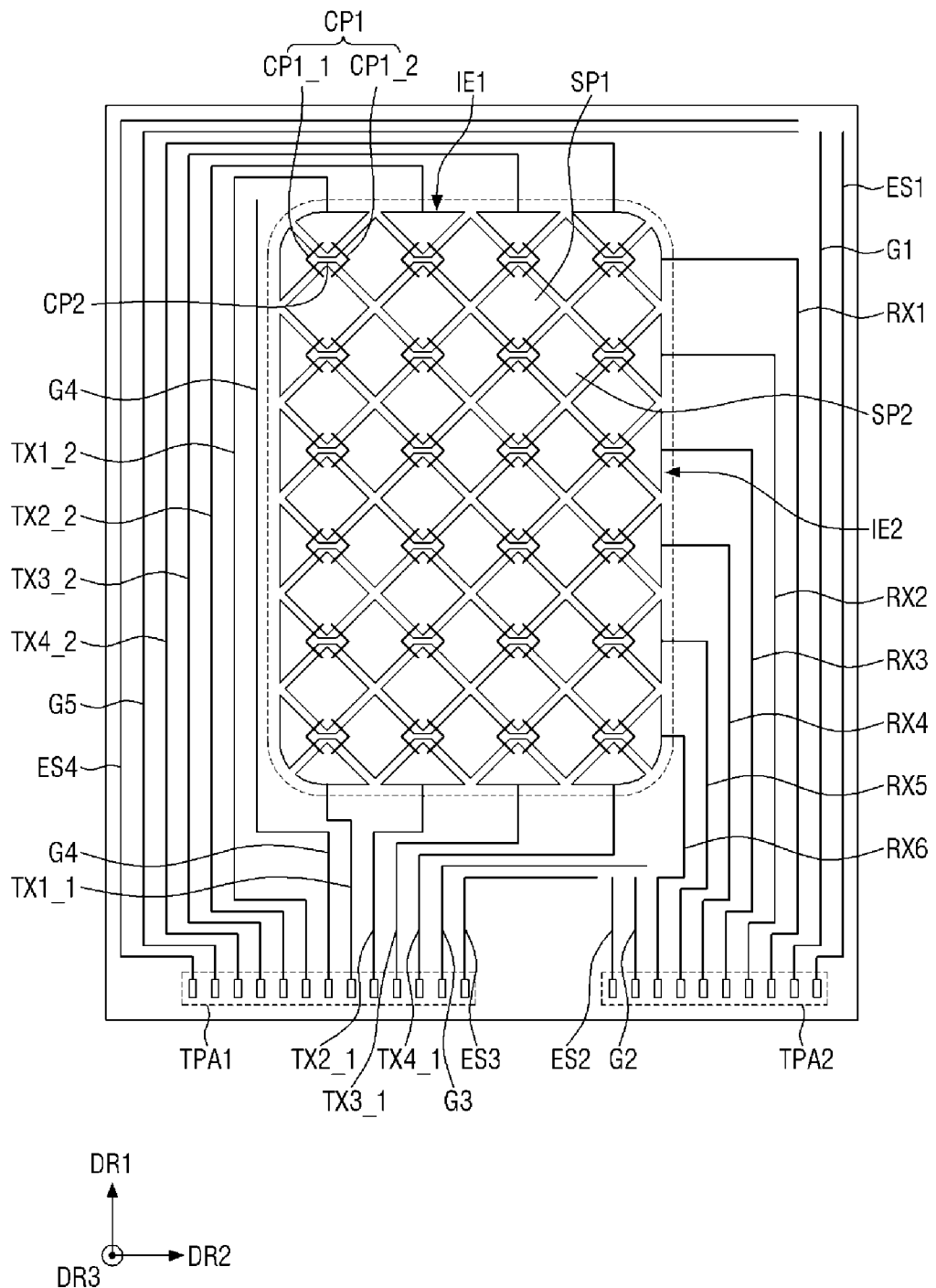
FIG. 4 illustrates an embodiment of a touch member.
Figure 5:
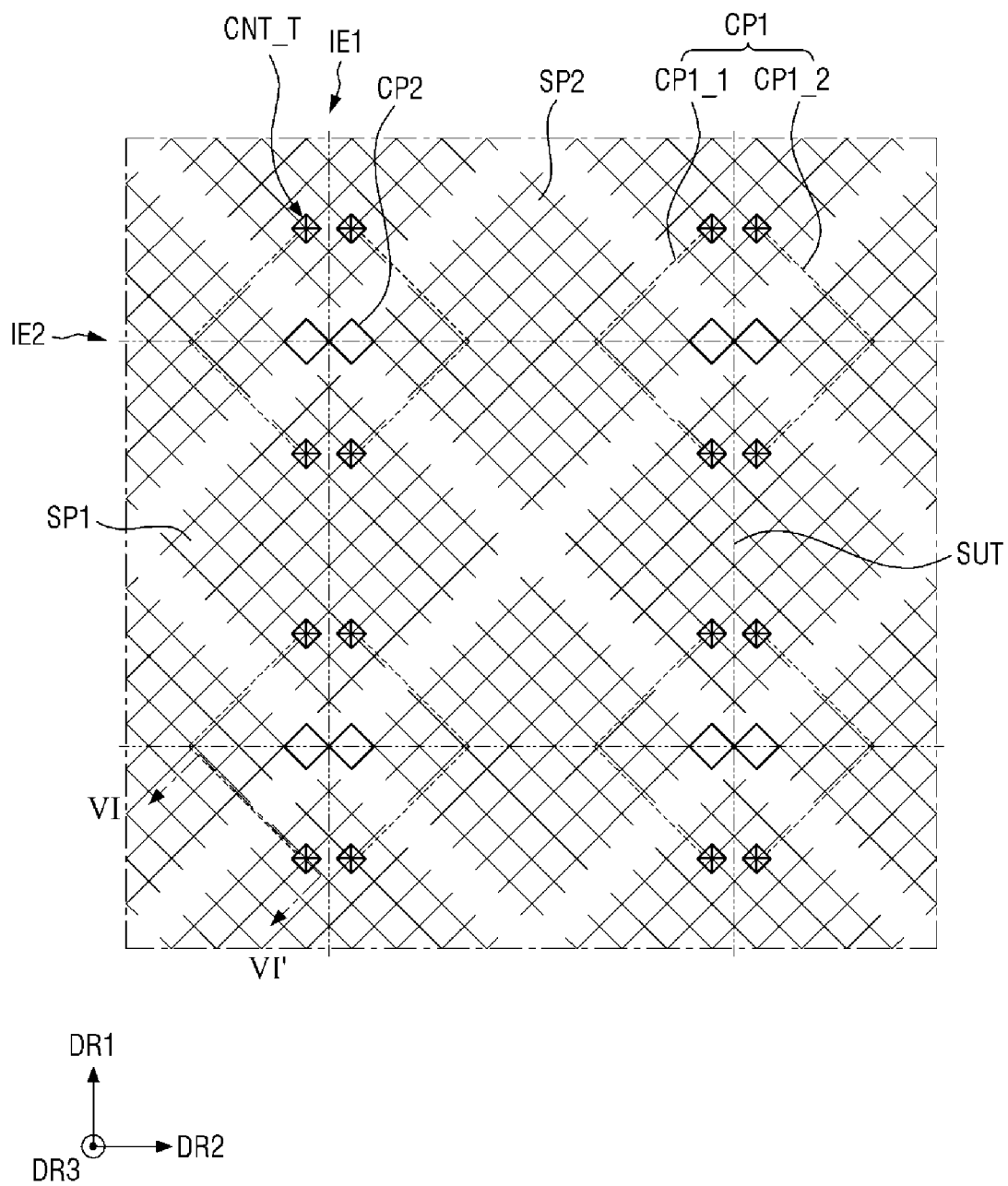
FIG. 5 illustrates an embodiment of a touch region.
Figure 6:
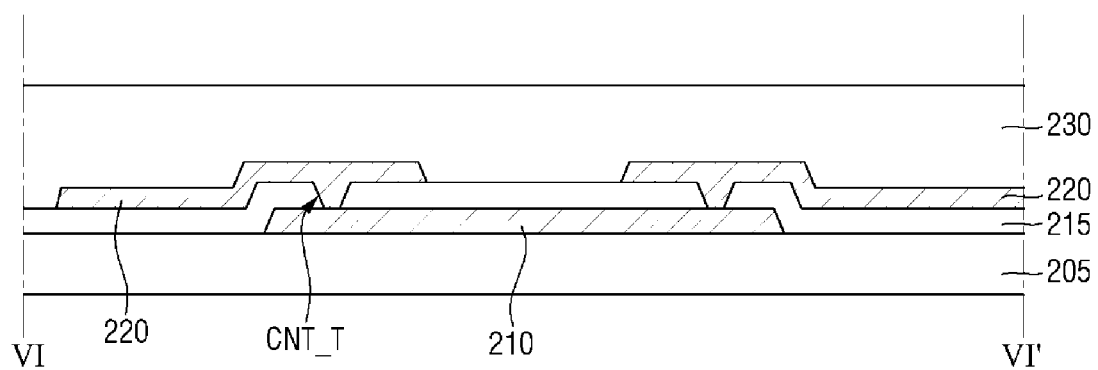
FIG. 6 illustrates a cross-sectional view taken along line VI-VI' of FIG. 5.

FIG. 4 is a schematic plan view of a touch member according to an embodiment. FIG. 5 is an enlarged view of part of the touch region of FIG. 4. FIG. 6 is a cross-sectional view taken along line VI-VI' of FIG. 5.

Referring to FIGS. 4 to 6, the touch member may include a touch region located in the active area AAR and a non-touch region located in the non-active area NAR. Embodiments of the touch member and the non-touch region are set forth in FIG. 4 for convenience of illustration. In one embodiment, the shapes of the touch region and the non-touch region may be substantially the same as those of the active area AAR and the non-active area NAR described above.

The touch region of the touch member may include a plurality of first sensing electrodes IE1 (or first touch electrodes) and a plurality of second sensing electrodes IE2 (or second touch electrodes). The first sensing electrodes IE1 or the second sensing electrodes IE2 may be driving electrodes and the others may be sensing electrodes. In this embodiment, the first sensing electrodes IE1 are driving electrodes and the second sensing electrodes IE2 are sensing electrodes.

The first sensing electrodes IE1 may be extended in the first direction DR1, may include a plurality of first sensor portions SP1 arranged in the first direction DR1, and first connecting parts CP1 may electrically connect adjacent ones of the first sensor portions SP1. The plurality of first sensing electrodes IE1 may be arranged in the second direction DR2.

The second sensing electrodes IE2 may be extended in the second direction DR2, may include a plurality of second sensor portions SP2 arranged in the second direction DR2, and the second connecting parts CP2 may electrically connect adjacent ones of the second sensor portions SP2. The second sensing electrodes IE2 may be arranged in the first direction DR1. In this embodiment, four first sensing electrodes IE1 and six second sensing electrodes IE2 are arranged. However, it is to be understood that different numbers of the first sensing electrodes IE1 and/or the second sensing electrodes IE2 may be included in another embodiment.

At least some of the first sensor portions SP1 and the second sensor portions SP2 may have a diamond shape. Some of the first sensor portions SP1 and the second sensor portions SP2 may have a truncated diamond shape. For example, all or some of the first sensor portions SP1 and the second sensor portions SP2 (except the first and last ones in the extension direction) may have a diamond shape, and each of the first and last ones in the extension direction may have a triangle shape obtained by cutting the diamond shape. The first sensor portions SP1 and the second sensor portions SP2 in the diamond shape may have substantially the same size and/or shape. The first sensor portions SP1 and the second sensor portions SP2 in the triangle shape may have substantially the same size and/or shape. It is, however, to be understood that the present disclosure is not limited thereto. The first sensor portions SP1 and the second sensor portions SP2 may have a variety of shapes and sizes in other embodiments.

Figure 7:
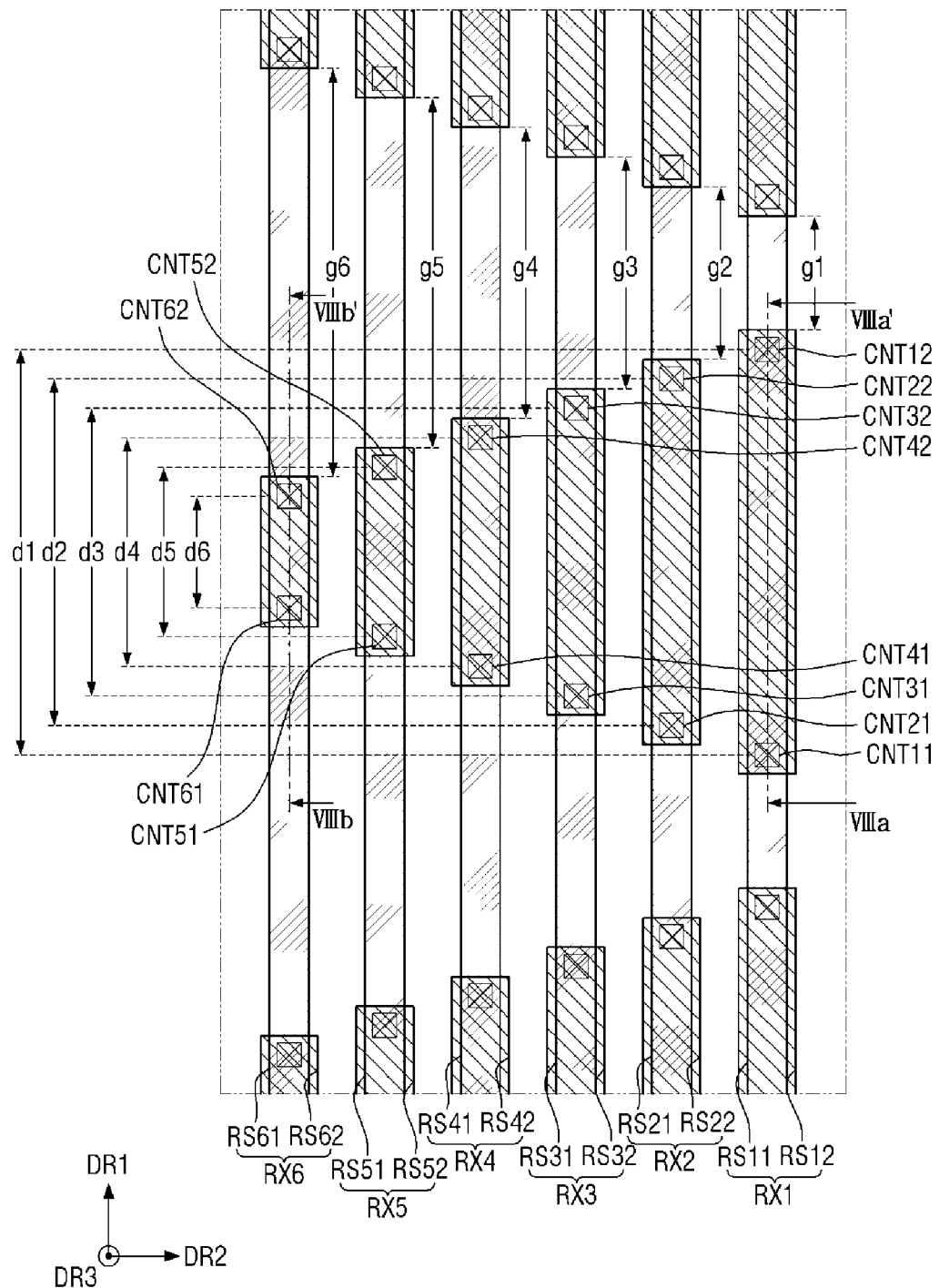
FIG. 7 illustrates an embodiment including touch sensing lines.

Each of the first sensor portions SP1 of the first sensing electrodes IE1 and the second sensor portions SP2 of the second sensing electrodes IE2 may include a predetermined pattern, e.g., a planar pattern or a mesh pattern. When the first sensor portions SP1 and the second sensor portions SP2 include a planar pattern, the first sensor portions SP1 and the second sensor portions SP2 may be formed as a transparent conductive layer. When the first sensor portions SP1 and the second sensor portions SP2 include a mesh pattern disposed along the non-emission areas as illustrated in FIGS. 5 and 7, it is possible to employ an opaque, low-resistance metal without interfering with the propagation of the emitted light. In the following description, each of the first sensor portions SP1 and the second sensor portions SP2 include a mesh pattern. It is, however, to be understood that a pattern different from a mesh pattern or planar pattern may exist in another embodiment.

Each of the first connecting parts CP1 may connect a vertex of the diamond or triangle shape of a first sensor portion SP1 with that of an adjacent first sensor portion SP1. Each of the second connecting parts CP2 may connect a vertex of the diamond or triangle shape of a second sensor portion SP2 with that of an adjacent second sensor portion SP2. The width of the first connecting parts CP1 and the second connecting parts CP2 may be less than the width of the first sensor portions SP1 and the second sensor portions SP2.

The first sensing electrodes IE1 and the second sensing electrodes IE2 may be insulated from each other and intersect each other. The first sensing electrodes IE1 are connected to one another by a conductive layer and the second sensing electrodes IE2 are connected to one another by another conductive layer disposed on a different layer at the intersections, such that the first sensing electrodes IE1 can be insulated from the second sensing electrodes IE2. The first sensing electrodes IE1 can be connected to one another by the first connecting parts CP1 while the second sensing electrodes IE2 can be connected to one another by the second connecting parts CP2, so that they can be insulated from each other while intersecting each other. To do so, the first connecting parts CP1 and/or the second connecting parts CP2 may be located on a different layer from the first sensing electrode IE1 and the second sensing electrode IE2.

For example, the first sensor portions SP1 of the first sensing electrodes IE1 and the second sensor portions SP2 of the second sensing electrodes IE2 may be formed as a conductive layer located on the same layer, and neither of the first sensor portions SP1 and the second sensor SP2 may intersect or overlap with each other. The adjacent ones of the first sensor portions SP1 and second sensor portions SP2 may be physically separated from each other.

The second connecting parts CP2 may be formed of the same conductive layer as the second sensor portions SP2 and may connect the adjacent ones of the second sensor portions SP2. A first sensor portion SP1 of a first sensing electrode IE1 is physically separated from an adjacent sensor portion SP1 thereof, with respect to the area where a second connecting part CP2 passes. The first connecting parts CP1, connecting the first sensor portions SP1 with one another, may be formed of a different conductive layer from the first sensor portions SP1 and may traverse the area of the second sensing electrodes IE2. Each of the first connecting parts CP1 may be electrically connected to respective first sensor portions SP1 by a contact.

In one embodiment, there may be more than one first connecting parts CP1. For example, although not limited thereto, each of the first connection parts CP1 may include a first connecting part CP1_1 which overlaps an adjacent second sensing electrode IE2 on one side, and another first connecting part CP1_2 which overlaps another adjacent second sensing electrode IE2 on the other side. Because more than one first connecting part CP1 may connect two adjacent ones of the first sensor portions SP1, it is possible to prevent disconnection of the first sensing electrodes IE1 even when any of the first connecting parts CP1 is broken by static electricity or the like.

The first sensor portions SP1 and the second sensor portions SP2 (which are adjacent to each other) may form a unit sensing region SUT (e.g., see FIG. 5). For example, halves of two adjacent first sensor portions SP1 and halves of two adjacent second sensor portions SP2 may form a square or a rectangle, with respect to the intersection of the first sensing electrodes IE1 and the second sensing electrodes IE2. The area defined by the halves of the adjacent two first sensor portions SP1 and halves of the two adjacent second sensor portions SP2 may be a unit sensing region SUT. In one embodiment, a plurality of unit sensing regions SUT may be arranged in row and column directions.

In each of the unit sensing regions SUT, the capacitance value between the adjacent first sensor portions SP1 and the second sensor portions SP2 may be measured to determine whether or not a touch input has occurred. If so, the position of the touch input may be obtained as touch input coordinates. For example, a touch may be sensed by, for example, measuring mutual capacitance.

In one embodiment, each unit sensing region SUT may be larger than the size of a pixel. For example, each unit sensing region SUT may have an area equal to the area occupied by a plurality of pixels. The length of a side of the unit sensing area SUT may be in the range of, but is not limited to, about 4 to about 5 mm.

A plurality of touch signal lines may be disposed in the non-active area NAR outside the touch region. The touch signal lines may be extended from the touch pads TPA1 and TPA2, and the touch pads TPA1 and TPA2 may be located in the subsidiary region SR (e.g., see FIG. 1). For example, the touch signal lines may be extended from the touch pads TPA1 and TPA2 located in the subsidiary region SR to the non-active area NAR of the main region MR through the bending region BR (e.g., see FIG. 1).

The touch signal lines include touch driving lines TX and touch sensing lines RX. In an embodiment, the touch signal lines may further include touch ground lines G and/or touch antistatic lines ES. The touch driving lines TX are connected to the first sensing electrodes IE1. In an embodiment, a plurality of touch driving lines may be connected to a single first sensing electrode IE1. For example, the touch driving lines may include first touch driving lines TX1_1, TX2_1, TX3_1 and TX4_1 connected to the lower end of the first sensing electrodes IE1, and second touch driving lines TX1_2, TX2_2, TX3_2 and TX4_2 connected to the upper end of the first sensing electrodes IE1. The first touch driving lines TX1_1, TX2_1, TX3_1 and TX4_1 may be extended from touch signal line pads TPA1 as indicated by the upper arrow in the first direction DR1 and may be connected to the lower end of the first sensing electrodes IE1. The second touch driving lines TX1_2, TX2_2, TX3_2 and TX4_2 may be extended from the touch signal line pads TPA1 as indicated by the upper arrow in the first direction DR1 and may go along the left edge of the touch region to be connected to the upper end of the first sensing electrodes IE1.

The touch sensing lines RX are connected to the second sensing electrodes IE2. In an embodiment, a single touch sensing line RX may be connected to a single second sensing electrode IE2. The touch sensing lines RX1, RX2, RX3, RX4, RX5 and RX6 may be extended from touch signal line pads TPA2 (as indicated by the upper arrow in the first direction DR1) and may go along the right edge of the touch region to be connected to the right end of the second sensing electrodes IE2. The touch sensing lines RX1, RX2, RX3, RX4, RX5 and RX6 may be spaced apart from one another in the second direction DR2.

Each of the touch sensing lines RX: RX1, RX2, RX3, RX4, RX5 and RX6 may include a stack of multiple layers. The multiple layers may be electrically connected with each other through contact holes. At least one layer of the multiple layers may include a plurality of divided patterns. The length by which the divided patterns of one of the touch sensing lines RX: RX1, RX2, RX3, RX4, RX5 or RX6 are electrically connected to the other layers thereof may be different from the length by which the divided patterns of the others of the touch sensing lines RX: RX1, RX2, RX3, RX4, RX5 or RX6 are electrically connected to the other layers thereof. Accordingly, it is possible to individually adjust the overall electrical resistance of each of the touch sensing lines RX: RX1, RX2, RX3, RX4, RX5 and RX6, and the overall electrical resistance of each of the touch sensing lines RX1, RX2, RX3, RX4, RX5 and RX6 can become uniform. Embodiments are described with reference to FIGS. 7 and 8.

Figure 8:
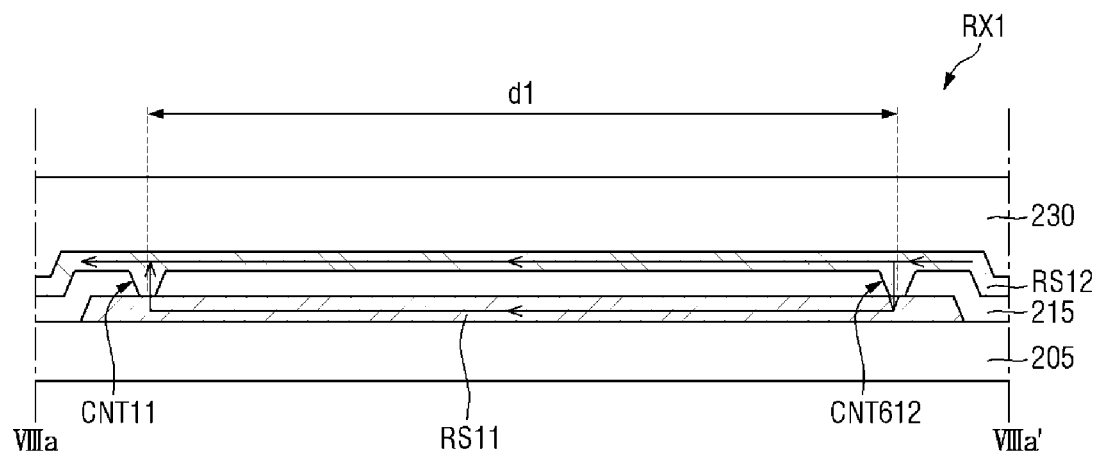
FIG. 8 illustrates cross-sectional views taken along lines VIIIa-VIII'a and VIIIb-VIII'b of FIG. 7.
Figure 8:
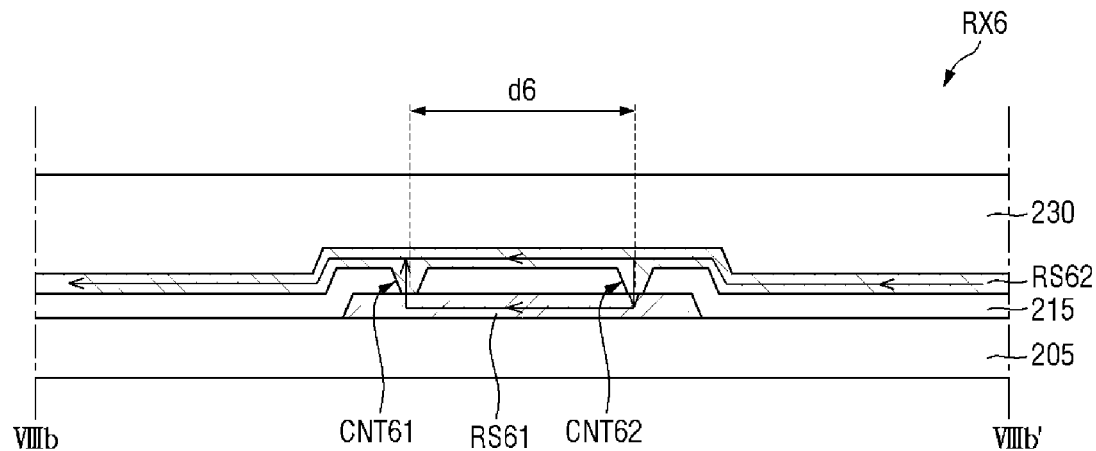
Figure 8:
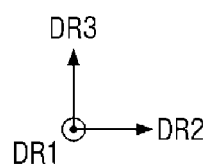

FIG. 7 is an enlarged view of some of touch sensing lines according to an embodiment. FIG. 8 shows cross-sectional views taken along lines VIIIa-VIII'a and VIIIb-VIII'b of FIG. 7. FIG. 8 schematically shows the flows of electric currents in the touch sensing lines RX1, RX2, RX3, RX4, RX5, and RX6.

Referring to FIGS. 7 and 8, the touch sensing lines RX1, RX2, RX3, RX4, RX5 and RX6 may include first sub-touch sensing lines RS11, RS21, RS31, RS41, RS51 and RS61, and second sub-touch sensing lines RS12, RS22, RS32, RS42, RS52 and RS62, respectively. The first sub-touch sensing lines RS11, RS21, RS31, RS41, RS51 and RS61 and the second sub-touch sensing lines RS12, RS22, RS32, RS42, RS52 and RS62 are in the non-active area NAR (e.g., see FIG. 1).

The first sub-touch sensing lines RS11, RS21, RS31, RS41, RS51 and RS61 may be formed as a first touch conductive layer 210. The second sub-touch sensing lines RS12, RS22, RS32, RS42, RS52 and RS62 may be formed as a second touch conductive layer 220. It is, however, to be understood that the present disclosure is not limited thereto. The sub-touch sensing lines RS11, RS21, RS31, RS41, RS51 and RS61 of the touch sensing lines RX1, RX2, RX3, RX4, RX5 and RX6 may at least partially overlap with the second sub-touch sensing lines RS12, RS22, RS32, RS42, RS52 and RS62 in the thickness direction (the third direction DR3), respectively.

There may be more than one first sub-touch sensing lines RS11, RS21, RS31, RS41, RS51 and RS61 and/or more than one second sub-touch sensing lines RS12, RS22, RS32, RS42, RS52 and RS62. For example, the first sub-touch sensing lines RS11, RS21, RS31, RS41, RS51 and RS61 and/or the second sub-touch sensing lines RS12, RS22, RS32, RS42, RS52 and RS62 may be implemented as divided patterns. Each of the divided patterns may include, but is not limited to, a predetermined shape, e.g., an island shape or another shape.

In the following description, the first sub-touch sensing lines RS11, RS21, RS31, RS41, RS51 and RS61 are implemented as divided patterns. The second sub-touch sensing lines RS12, RS22, RS32, RS42, RS52 and RS62 are implemented as single pieces. It is, however, to be understood that the present disclosure is not limited thereto.

When each of the first sub-touch sensing lines RS11, RS21, RS31, RS41, RS51 and RS61 is implemented as divided patterns, the divided patterns of one of the first sub-touch sensing lines RS11, RS21, RS31, RS41, RS51 or RS61 may have substantially the same shape. For example, the divided patterns of the first sub-touch sensing line RS11 of the first touch sensing line RX1 may have substantially the same shape. It is, however, to be understood that the present disclosure is not limited thereto. In addition, the divided patterns of the first sub-touch sensing line RS21 of the second touch sensing line RX2 may have substantially the same shape, which is different from the shape of the divided patterns of the first sub-touch sensing line RS11 of the first touch sensing line RX1. A similar description may be applied to the other sub-touch sensing lines RS31, RS41, RS51, and RS61 as well.

The first sub-touch sensing lines RS11, RS21, RS31, RS41, RS51 and RS61 and the second sub-touch sensing lines RS12, RS22, RS32, RS42, RS52 and RS62 may be electrically connected to each other through contact holes CNT11, CNT12, CNT21, CNT22, CNT31, CNT32, CNT41, CNT42, CNT51, CNT52, CNT61 and CNT62, respectively. The first sub-touch sensing lines RS11, RS21, RS31, RS41, RS51 and RS61 and the second sub-touch sensing lines RS12, RS22, RS32, RS42, RS52 and RS62 may be connected in parallel with each other, respectively. For example, the first sub-touch sensing line RS11 of the first touch sensing line RX1 may be in contact with the second sub-touch sensing line RS12 of the first touch sensing line RX1 through the contact holes CNT11 and CNT12 penetrating through a first touch insulating layer 213 to expose the first sub-touch sensing line RS11. The above description on the first touch sensing line RX1 can be applied in a similar manner to second to sixth touch sensing lines RX2, RX3, RX4, RX5 and RX6.

When each of the second sub-touch sensing lines RS12, RS22, RS32, RS42, RS52 and RS62 is formed as a single piece, the second sub-touch sensing lines RS12, RS22, RS32, RS42, RS52 and RS62 may have different lengths from the touch pads TPA2 to the second sensing electrodes IE2. For example, the lengths of the touch sensing lines RX1, RX2, RX3, RX4, RX5 and RX6 or the second sub-touch sensing lines RS12, RS22, RS32, RS42, RS52 and RS62 may be longer toward the outer side of the display device 1. In this instance, among the second sub-touch sensing lines RS12, RS22, RS32, RS42, RS52 and RS62, the second sub-touch sensing line RS12 of the first touch sensing line RX1 may have the longest length, while the second sub-touch sensing line RS62 of the sixth touch sensing line RX6 may have the shortest length. It is, however, to be understood that the present disclosure is not limited thereto.

The first sub-touch sensing lines RS11, RS21, RS31, RS41, RS51 and RS61 may have different lengths. For example, the lengths of the first sub-touch sensing lines RS11, RS21, RS31, RS41, RS51 and RS61 in the first direction DR1 may be longer toward the first touch sensing line RX1 and may be shorter toward the sixth touch sensing line RX6. It is, however, to be understood that the present disclosure is not limited thereto.

The contact holes (in which the first sub-touch sensing lines RS11, RS21, RS31, RS41, RS51 and RS61 and the second sub-touch sensing lines RS12, RS22, RS32, RS42, RS52 and RS62 are in contact with each other, respectively) may be located at respective ends of the first sub-touch sensing lines RS11, RS21, RS31, RS41, RS51 and RS61. For example, the position at which the first sub-touch sensing line RS11 and the second sub-touch sensing line RS12 of the first touch sensing wire RX are in contact with each other (the position of the contact holes CNT11 and CNT12) may be located at respective ends of the first sub-touch sensing line RS11 in the second direction DR2. It is, however, to be understood that the present disclosure is not limited thereto.

The lengths by which the first sub-touch sensing lines RS11, RS21, RS31, RS41, RS51 and RS61 are electrically connected to the second sub-touch sensing lines RS12, RS22, RS32, RS42, RS52 and RS62, respectively, may be different from one another. For example, the lengths by which the first sub-touch sensing lines RS11, RS21, RS31, RS41, RS51 and RS61 are electrically connected to the second sub-touch sensing lines RS12, RS22, RS32, RS42, RS52 and RS62, respectively, may become longer toward the outer side of the display device 1. Thus, for example, the lengths by which the first sub-touch sensing lines RS11, RS21, RS31, RS41, RS51 and RS61 are electrically connected to the second sub-touch sensing lines RS12, RS22, RS32, RS42, RS52 and RS62, respectively, may become longer toward the first touch sensing line RX1 and may become shorter toward the sixth touch sensing line RX6. It is, however, to be understood that the present disclosure is not limited thereto.

In one embodiment, a first length d1 between the contact holes CNT11 and CNT12 electrically connecting the first sub-touch sensing line RS11 with the second sub-touch sensing line RS12 of the first touch sensing line may longer than a sixth length d6 between the contact holes CNT61 and CNT62 electrically connecting the first sub-touch sensing line RS61 and the second sub-touch sensing line RS62 of the sixth touch sensing line.

In the following description, the expression "electrically connected length" may be indicative of the distance between the contact holes electrically connecting the first sub-touch sensing lines RS11, RS21, RS31, RS41, RS51 and RS61 with the second sub-touch sensing lines RS11, RS22, RS32, RS42, RS52 and RS62, respectively. For example, the expression "electrically connected length" may correspond to the length of each of the first sub-touch sensing lines RS11, RS21, RS31, RS41, RS51 and RS61 in which electric current actually flows when the first sub-touch sensing lines RS11, RS21, RS31, RS41, RS51 and RS61 are electrically connected to the second sub-touch sensing lines RS21, RS22, RS23, RS24, RS25 and RS26, respectively.

Additionally, when each of the first sub-touch sensing lines RS11, RS21, RS31, RS41, RS51 and RS61 is implemented as divided patterns, the expression "electrically connected length" may refer to the sum of the lengths by which the divided patterns of each of the first sub-touch sensing lines RS11, RS21, RS31, RS41, RS51 and RS61 are electrically connected to the second sub-touch sensing lines RS21, RS22, RS23, RS24, RS25 and RS26, respectively.

By adjusting the lengths by which the first sub-touch sensing lines RS11, RS21, RS31, RS41, RS51 and RS61 are electrically connected to the second sub-touch sensing lines RS21, RS22, RS23, RS24, RS25 and RS26, respectively, it is possible to individually adjust the electrical resistance of each of the touch sensing lines RX1, RX2, RX3, RX4, RX5 and RX6. For example, the longer the lengths of the second sub-touch sensing lines RS21, RS22, RS23, RS24, RS25 and RS26 of the touch sensing lines RS11, RS21, RS31, RS41, RS51 and RS61, the longer the lengths by which the first sub-touch sensing lines RS11, RS21, RS31, RS41, RS51, RS61 are electrically connected to the second sub-touch sensing lines RS21, RS22, RS23, RS24, RS25 and RS26.

The electrical resistance of each of the touch sensing lines RX1, RX2, RX3, RX4, RX5 and RX6 may be calculated, for example, based on Equation 1 and Equation 2. Equation 1 may be used as a basis for calculating two resistors connected in parallel. Equation 2 may be indicative of the relationship between electrical resistance, length and cross-sectional area.

$$\frac{1}{RX} = \frac{1}{R1} + \frac{1}{R2} \tag{1}$$

$$R = \frac{L}{A} \tag{2}$$

In Equation 1, RX denotes the electrical resistance of each of the touch sensing lines RX1, RX2, RX3, RX4, RX5 and RX6 in which the first sub-touch sensing lines RS11, RS21, RS31, RS41, RS51 and RS61 are connected in parallel with the second sub-touch sensing lines RS12, RS22, RS32, RS42, RS52 and RS62, respectively. In addition, R1 denotes the electrical resistance of each of the first sub-touch sensing lines RS11, RS21, RS31, RS41, RS51 and RS61 of the touch sensing lines RX1, RX2, RX3, RX4, RX5 and RX6, and R2 denotes the electrical resistance of each of the second sub-touch sensing lines RS12, RS22, RS32, RS42, RS52 and RS62 of the touch sensing lines RX1, RX2, RX3, RX4, RX5 and RX6.

The reciprocal of the electrical resistance of the area of each of the touch sensing lines RX1, RX2, RX3, RX4, RX5 and RX6 where the first sub-touch sensing lines RS11, RS21, RS31, RS41, RS51 and RS61 and the second sub-touch sensing lines RS12, RS22, RS32, RS42, RS52 and RS62 are connected in parallel, respectively, may be equal to the sum of the reciprocal of the electrical resistance of each of the first sub-touch sensing lines RS11, RS21, RS31, RS41, RS51 and RS61 of the touch sensing lines RX1, RX2, RX3, RX4, RX5 and RX6 and the reciprocal of the electrical resistance of each of the second sub-touch sensing lines RS12, RS22, RS32, RS42, RS52 and RS62 of the touch sensing lines RX1, RX2, RX3, RX4, RX5 and RX6.

In Equation 2, R denotes electrical resistance, L denotes the resistor length, and A denotes the cross-sectional area of the resistor. For example, the electrical resistance of a conductive line may be proportional to the length of the line and may be inversely proportional to the cross-sectional area of the line. The electrical resistances of the second sub-touch sensing lines RS12, RS22, RS32, RS42, RS52 and RS62 of the touch sensing lines RX1, RX2, RX3, RX4, RX5 and RX6 may increase toward the first touch sensing line RX1. For example, when the second sub-touch sensing line RS12 of the first touch sensing line RX1 is longer than the second sub-touch sensing line RS62 of the sixth touch sensing line RX6, the electrical resistance of the second sub-touch sensing line RS12 of the first touch sensing line RX1 may be greater than the electrical resistance of the second sub-touch sensing line RS62 of the sixth touch sensing line RX6.

By connecting the first sub-touch sensing lines RS11, RS21, RS31, RS41, RS51 and RS61 in parallel to the second sub-touch sensing lines RS12, RS22, RS32, RS42, RS52 and RS62 having different electrical resistances, respectively, and adjusting the lengths by which the two kinds of the sub-touch sensing lines are electrically connected to each other, it is possible to individually adjust the electrical resistance of each touch sensing lines RX1, RX2, RX3, RX4, RX5 and RX6.

The electrical resistance of each of the touch sensing lines RX1, RX2, RX3, RX4, RX5 and RX6 may be reduced as the area of each of the second sub-touch sensing lines RS21, RS22, RS23, RS24, RS25 and RS26 in which the first sub-touch sensing lines RS11, RS21, RS31, RS41, RS51 and RS61 are connected in parallel to them, respectively, is larger. For example, the areas of the second sub-touch sensing lines RS21, RS22, RS23, RS24, RS25 and RS26 in the parallel connection, along with the areas of the first sub-touch sensing lines RS11, RS21, RS31, RS41, RS51 and RS61 in the parallel connection, may have relatively low electrical resistances in the touch sensing lines RX1, RX2, RX3, RX4, RX5 and RX6. Accordingly, the electrical resistances of the touch sensing lines RX1, RX2, RX3, RX4, RX5 and RX6 can be reduced as the areas in which the second sub-touch sensing lines RS12, RS22, RS32, RS42, RS52 and RS62 are in the parallel connection are lager.

For example, the length by which the second sub-touch sensing line RS12 of the first touch sensing line RX1 is electrically connected to the first sub-touch sensing line RS11 may be longer than the length by which the second sub-touch sensing line RS62 of the sixth touch sensing line RX6 is electrically connected to the first sub-touch sensing line RS61. For example, the length by which the second sub-touch sensing line RS12 of the first touch sensing line RX1 is connected in parallel to the first sub-touch sensing line RS11 may be greater than the length by which the second sub-touch sensing line RS62 of the sixth touch sensing line RX6 is connected in parallel to the first sub-touch sensing line RS61. In this instance, even though the electrical resistance of the second sub-touch sensing line RS12 of the first touch sensing line RX1 is greater than the electrical resistance of the second sub-touch sensing line RS62 of the sixth touch sensing line RX6, because they are connected to the first sub-touch sensing lines RS11 and RS61 in parallel, respectively, the electrical resistance of the first touch sensing line RX1 can be reduced more than that of the electrical resistance of the sixth touch sensing line RX6.

Therefore, by adjusting the lengths by which the second sub-touch sensing lines RS21, RS22, RS23, RS24, RS25 and RS26 are connected in parallel to the first sub-touch sensing lines RS11, RS21, RS31, RS41, RS51 and RS61, respectively, it is possible to individually adjust the electrical resistance of each of the touch sensing lines RX1, RX2, RX3, RX4, RX5 and RX6. Moreover, by adjusting the distances d1 and d6 between the contact holes CNT11, CNT12, CNT61 and CNT62 in which the first sub-touch sensing lines RS11 and RS61 are in contact with the second sub-touch sensing lines RS12 and RS62, respectively, according to the resistances of the first sub-touch sensing lines RS11 and RS61 and the second sub-touch sensing lines RS12 and 62, the electrical resistance of the first touch sensing line RX1 can be substantially equal to that of the sixth touch sensing line RX6. It is to be understood that the foregoing description can be applied in a similar manner to the second to fifth touch sensing lines RX2, RX3, RX4 and RX5.

Through the first sub-touch sensing lines RS11, RS21, RS31, RS41, RS51 and RS61, it is possible to individually adjust the electrical resistance of each of the touch sensing lines RX1, RX2, RX3, RX4, RX5 and RX6, and is also possible to uniformly adjust the electrical resistance of each of the touch sensing lines RX1, RX2, RX3, RX4, RX5 and RX6. As a result, the touch sensitivity of the touch member can become more uniform. In one embodiment, the resistances of the touch sensing line RX1, RX2, RX3, RX4, RX5 and RX6 may be substantially equal. In another embodiment, the resistances of the touch sensing line RX1, RX2, RX3, RX4, RX5 and RX6 may be different. At least in this latter case, no separate space for such design has to be used. Thus, the non-active area NAR (e.g., see FIG. 1) can be reduced, to allow a viewer to experience more immersive content.

In addition, in calculating the electrical resistance of each of the touch sensing lines RX1, RX2, RX3, RX4, RX5 and RX6, contact resistances between the first sub-touch sensing lines RS11, RS21, RS31, RS41, RS51 and RS61 and the second sub-touch sensing lines RS12, RS22, RS32, RS42, RS52 and RS62 may be considered.

In addition, the first sub-touch sensing lines RS11, RS21, RS31, RS41, RS51 and RS61 may be spaced apart from one another by certain gaps. For example, the divided patterns of the first sub-touch sensing lines RS11, RS21, RS31, RS41, RS51 and RS61 may have different gaps g1, g2, g3, g4, g5 and g6, respectively. The gaps g1, g2, g3, g4, g5 and g6 may become longer toward the first touch sensing line RX1 and may become shorter toward the sixth touch sensing line RX6. It is, however, to be understood that the present disclosure is not limited thereto.

Each of the first sub-touch sensing lines RS11, RS21, RS31, RS41, RS51 and RS61 may be extended in the first direction DR1, and the gaps of the divided patterns of each of the first sub-touch sensing lines RS11, RS21, RS31, RS41, RS51 and RS61 may be arranged along the first direction DR1. The first sub-touch sensing lines RS11, RS21, RS31, RS41, RS51 and RS61 and the gaps thereof may be arranged alternately.

Accordingly, it is possible to suppress or prevent defects due to particles or the like in the first sub-touch sensing lines RS11, RS21, RS31, RS41, RS51 and RS61. For example, even if particles or the like are seated at the gaps between the divided patterns of the first sub-touch sensing lines RS11, RS21, RS31, RS41, RS51 and RS61, it is possible to prevent a short-circuit between the first sub-touch sensing lines RS11, RS21, RS31, RS41, RS51 and RS61. Accordingly, by improving the issue of such defects, process yield can be increased and reliability of the touch member can be improved.

It is to be understood that the foregoing description on the touch sensing lines RX can be applied in a similar manner to the touch driving lines TX. For example, each of the touch driving lines TX may include a stack of multiple layers, and at least one of the multiple layers may be implemented as divided patterns.

Referring back to FIGS. 4 to 6, touch antistatic lines ES may be disposed at the outermost position of the touch signal lines. In an embodiment, the touch antistatic lines may include a first touch antistatic line ES1, a second touch antistatic line ES2, a third touch antistatic line ES3, and a fourth touch antistatic line ES4. The first to fourth touch antistatic lines ES may surround the touch region and the signal lines in a ring shape.

The first touch antistatic line ES1 may cover a touch signal line located on the right side from its outer side. The second touch antistatic line ES2 may cover a touch signal line located on the right side from its inner side. A third touch antistatic line ES3 may cover the inner side of a touch signal line located on the left side and the outer side of a touch signal line extended in the second direction DR2 on the lower side of the touch region. A fourth touch antistatic line ES4 may cover the outer side of a touch signal line located on the left side and the outer side of a touch signal line extended in the second direction DR2 on the upper side of the touch region.

The touch ground lines G may be disposed between the signal lines and, for example, may include a first touch ground line G1, a second touch ground line G2, a third touch ground line G3, a fourth touch ground line G4 and a fifth touch ground line G5. The first touch ground line G1 may be disposed between the touch sensing lines RX and the first touch antistatic line ES1. The second touch ground line G2 may be disposed between the second touch antistatic line ES and the touch sensing lines RX. The third touch ground line G3 may be disposed between the first touch driving line TX_1 and the third touch antistatic line ES3. The fourth touch ground line G4 may be disposed between the first touch driving line TX_1 and the second touch driving line TX_2. The fifth touch ground line G5 may be disposed between the second touch driving line TX_2 and the fourth touch antistatic line ES4.

The touch member may include a base layer 205, a first touch conductive layer 210 on the base layer 205, a first touch insulating layer 215 on the first touch conductive layer 210, a second touch conductive layer 220 on the first touch insulating layer 215 and a second touch insulating layer 230 covering the second touch conductive layer 200. For example, the first touch conductive layer 210 is disposed on the base layer 205. The first touch conductive layer 210 is covered by the first touch insulating layer 215. The first touch insulating layer 215 insulates the first touch conductive layer 210 from the second touch conductive layer 220. The second touch conductive layer 220 is disposed on the first touch insulating layer 215. The second touch insulating layer 230 covers and protects the second touch conductive layer 220.

The base layer 205 may include an inorganic insulating material. For example, the base layer 205 may include a silicon nitride layer, a silicon oxynitride layer, a silicon oxide layer, a titanium oxide layer, or an aluminum oxide layer. In some embodiments, base layer 205 may be replaced with a second inorganic layer 193 forming a thin encapsulation layer to be described later.

Each of the first touch conductive layer 210 and the second touch conductive layer 220 may include a metal or a transparent conductive layer. For example, the metal may include aluminum, titanium, copper, molybdenum, silver, or an alloy thereof. The transparent conductive layer may include a transparent conductive oxide such as indium tin oxide (ITO), indium zinc oxide (IZO), zinc oxide (ZnO) and indium tin zinc oxide (ITZO), a conductive polymer such as PEDOT, metal nanowire, grahpene, etc. As described above, when the first touch conductive layer 210 and the second touch conductive layer 220 are disposed on the non-emission area, they do not interfere with the propagation of the emitted light even if they are an opaque, low-resistance metal.

The first touch conductive layer 210 and/or the second touch conductive layer 220 may include a multi-layered conductive layer. For example, the first touch conductive layer 210 and/or the second touch conductive layer 220 may have a three-layer structure of titanium/aluminum/titanium.

In an embodiment, the first connecting parts CP1 may be formed as the first touch conductive layer 210 and the first sensor portions SP1, the second sensor portions SP2 and the second connecting parts CP2 may be formed as the second touch conductive layer 220. It is, however, to be understood that the present disclosure is not limited thereto. In one embodiment, the first connecting parts CP1 may be formed as the second touch conductive layer 220 and the sensor portions SP1 and SP2 and the second connecting parts CP2 may be formed as the first touch conductive layer 210. The touch signal lines may be formed as either the first touch conductive layer 210 or the second touch conductive layer 220. In one embodiment, they may be formed as the first touch conductive layer 210 and the second touch conductive layer 220 connected by a contact. In other embodiments, the touch conductive layers forming the elements of the sensing electrodes and the signal lines may be modified in a variety of ways.

The first touch insulating layer 215 and the second touch insulating layer 230 may include an inorganic material or an organic material. In an embodiment, the first touch insulating layer 215 or the second touch insulating layer 230 may include an inorganic material and the other may include an organic material. According to an embodiment of the present disclosure, the first touch insulating layer 215 may include a silicon nitride layer, a silicon oxynitride layer, a silicon oxide layer, a titanium oxide layer, an aluminum oxide layer, etc. The second touch insulating layer 230 may include at least one selected from the group consisting of: an acrylic resin, a methacrylic resin, a polyisoprene, a vinyl resin, an epoxy resin, a urethane resin, a cellulose resin, a siloxane resin, a polyimide resin, a polyamide resin, and a perylene resin. When the second touch insulating layer 230 includes an organic material, it may have a generally flat upper surface despite the level differences thereunder.

Figure 9:
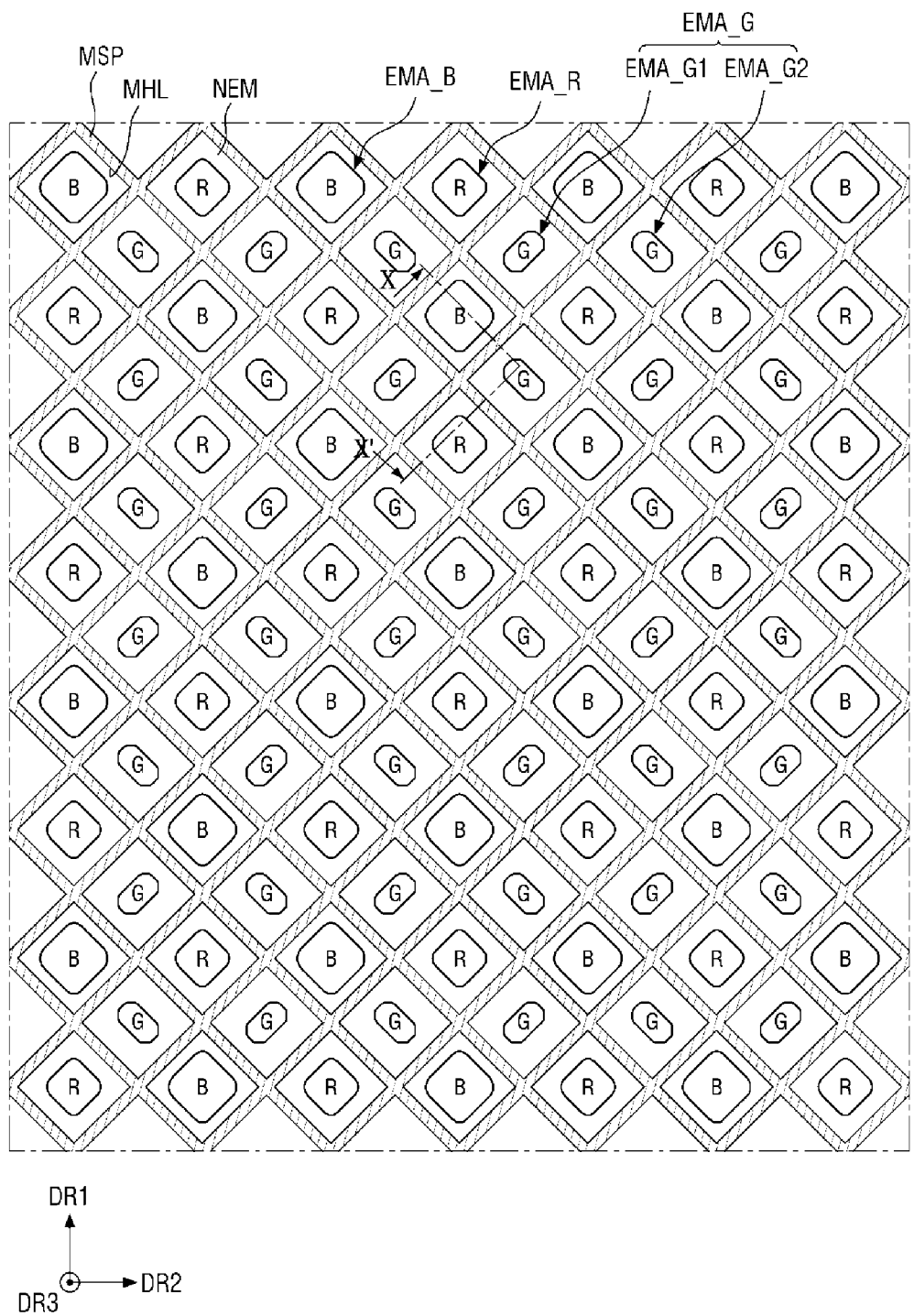
FIG. 9 illustrates an embodiment of a relationship between pixels and touch member in a mesh pattern in a display area.

FIG. 9 is a diagram showing the relative arrangement relationship between the pixels and the touch member in a mesh pattern in the display area according to an embodiment of the present disclosure.

Referring to FIG. 9, the display area of the active area AAR includes a plurality of pixels. Each pixel includes an emission area EMA that overlaps with an opening of a pixel-defining layer 126 (e.g., see FIG. 10) and may be so defined. A non-emission area NEM is disposed between the emission area EMA of a pixel and the emission area EMA of another pixel. The non-emission area NEM overlaps with the pixel-defining layer 126 (e.g., see FIG. 10) and may be so defined. The non-emission area NEM may surround the emission area EMA and may have a predetermined shape, e.g., a lattice shape or a mesh shape arranged along the diagonal directions intersecting with the first direction DR1 and the second direction DR2 when viewed from the top.

The mesh pattern MSP is disposed in the non-emission area NEM and, for example, may be substantially the same as at least one of the first touch conductive layer 210 or the second touch conductive layer 220 as described with reference to FIGS. 4 to 6.

The pixels may include first color pixels (e.g., red pixels), second color pixels (e.g., blue pixels), and third color pixels (e.g., green pixels). The shape of the emission area EMA of each color pixel may have a predetermined shape, e.g., generally an octagon, a square or a diamond with rounded corners. It is, however, to be understood that the present disclosure is not limited thereto. In other embodiments, the shape of each emission area EMA may be a circle, a diamond, other polygons with or without rounded corners, or another shape.

In an embodiment, the emission area EMA_R of the first color pixel and the emission area EMA_B of the second color pixel may have similar shapes, e.g., a diamond shape with rounded corners. The emission area EMA_B of the second color pixel may be larger than the emission area EMA_R of the first color pixel.

The emission area EMA_G of the third color pixel may be smaller than the emission area EMA_R of the first color pixel. The emission area EMA_G of the third color pixel may have an octagon shape that is inclined in a diagonal direction and having the maximum width in the inclined direction. The third color pixels may include third color pixels in which an emission area EMA_G1 is inclined in a first diagonal direction, and third color pixels in which an emission area EMA_G2 is inclined in a second diagonal direction.

The color pixels may be arranged in a variety of ways. In an embodiment, the first color pixels (e.g., red pixels) and the second color pixels (e.g., blue pixels) may be alternately arranged in the second direction DR2 to form a first row, while third color pixels (e.g., green pixels) may be arranged in the second direction DR2 to form a second row next to the first row. The pixels belonging to the second row (the third color pixels) may be arranged in a staggered manner in the second direction DR2 with respect to the pixels belonging to the first row. In the second row, the third color pixels that are inclined in the first diagonal direction and the third color pixels that are inclined in the second diagonal direction may be alternately arranged in the second direction DR2. The number of the third color pixels belonging to the second row may be twice the number of the first color pixels or the number of the second color pixels belonging to the first row.

In the third row, the color pixels of the like colors as the first row may be arranged in the reversed order. For example, in a column of the first row where a first color pixel is disposed, a second color pixel is disposed in the same column of the third row. In a column of the first row where a second color pixel is disposed, a first color pixel is disposed in the same column of the third row. In the fourth row, the third color pixels are arranged like the second row but they may be arranged in the reversed order in view of the shapes inclined with respect to the diagonal directions. For example, in a column of the second row where a third color pixel inclined in the first diagonal direction is disposed, a third color pixel inclined in the second diagonal direction is disposed in the same column of the fourth row. In a column of the second row where a third color pixel inclined in the second diagonal direction is disposed, a third color pixel inclined in the first diagonal direction is disposed in the same column of the fourth row. The arrangement of the first to fourth rows may be repeated in the first direction DR1. It is to be understood that the arrangement of the pixels is not limited to the above example.

The mesh pattern MSP may be disposed along the boundaries of the pixels in the non-emission area NEM. The mesh pattern MSP may not overlap with the emission area EMA. The width of the mesh pattern MSP may be less than the width of the non-emission area NEM. In an embodiment, mesh holes MHL exposed by the mesh pattern MSP may have a predetermined shape, e.g., a substantially diamond shape. The mesh holes MHL may have substantially the same size. In one embodiment, the mesh holes MHL may have different sizes depending on the size of the emission area EMA exposed via the mesh holes MHL or regardless of it. Although a single mesh hole MHL is formed in a single emission area EMA in the drawing, this is merely illustrative. In some implementations, a single mesh hole MHL may be formed across two or more emission areas EMA. An embodiment of a cross-sectional structure of the display device will be described.

Figure 10:
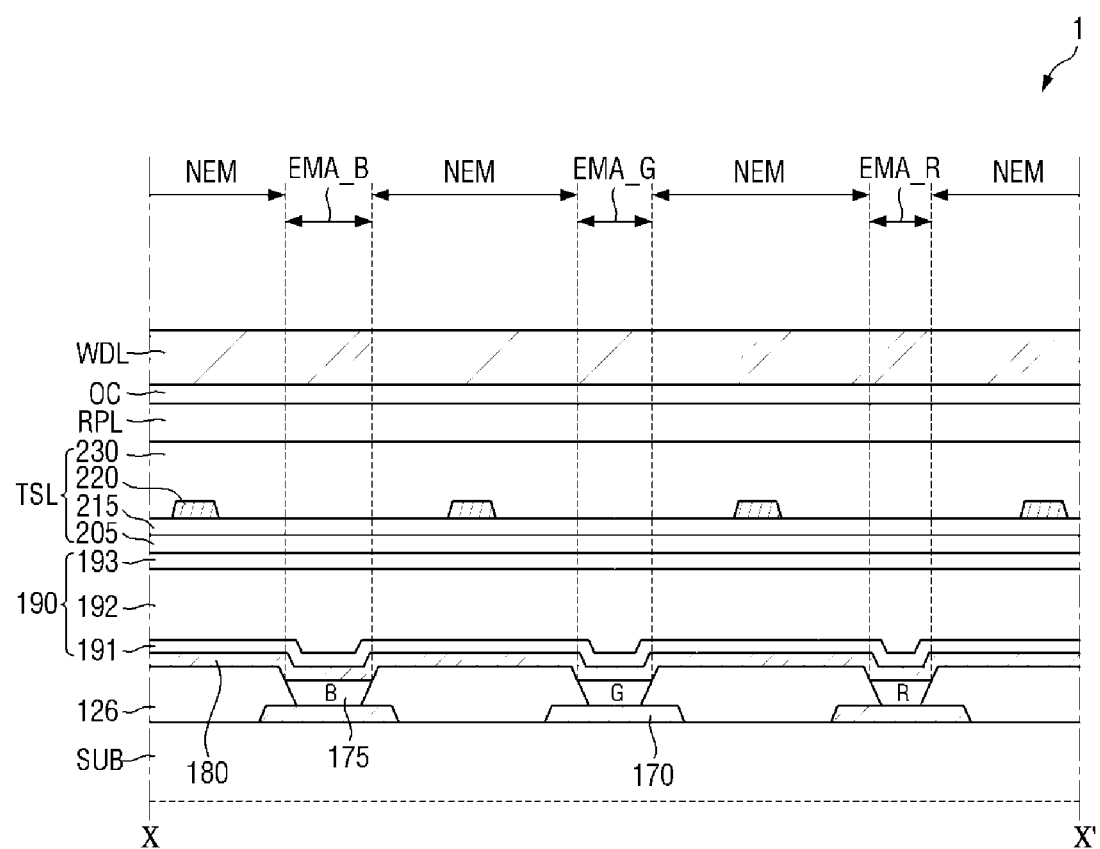
FIG. 10 illustrates a cross-sectional view taken along line X-X' of FIG. 9.

FIG. 10 is a cross-sectional view taken along line X-X' of FIG. 9. Referring to FIG. 10, the substrate SUB of the display device 1 may be made of an insulating material. Examples include a polymer resin Examples of the polymer material include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The substrate 100 may be a flexible substrate that can be bent, folded, and/or rolled. An example of the material of the flexible substrate may be, but is not limited to, polyimide (PI).

The anode electrode 170 is disposed on the substrate SUB. The anode electrode 170 is disposed directly on the substrate SUB for convenience of illustration. In one embodiment, a plurality of thin-film transistors and signal lines may be disposed between the substrate SUB and the anode electrode 170. The anode electrode 170 may be a pixel electrode disposed in each of the pixels and, for example, may have a stack structure of a material layer having a high work function. Examples include indium-tin-oxide (ITO), indium-zinc-oxide (IZO), zinc oxide (ZnO) and indium oxide (In2O3), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a mixture thereof. The layer having a high work function may be disposed above the reflective material layer, so that it is disposed closer to the organic layer 175. The anode electrode 170 may have, but is not limited to, a multilayer structure of, for example, ITO/Mg, ITO/MgF, ITO/Ag, and ITO/Ag/ITO.

The bank 126 may be disposed on the substrate SUB and over the anode electrode 170 and may include an opening exposing the anode electrode 170. The emission area EMA and the non-emission area NEM may be separated by the pixel-defining layer 126 and the opening thereof. The pixel-defining layer 126 may include, for example, an organic insulating material or may include an inorganic material.

The emissive layer is disposed on the anode electrode 170 exposed via the pixel-defining layer 126. The emissive layer may include an organic layer 175. The organic layer 175 may include an organic emitting layer and may further include a hole injecting/transporting layer and/or an electron injecting/transporting layer.

A cathode electrode 180 may be disposed on the organic layer 175 and, for example, may be a common electrode disposed across the pixels. The anode electrode 170, the organic layer 175 and the cathode electrode 180 may form an organic light-emitting element. The cathode electrode 180 may be in contact with the organic layer 175 as well as the upper surface of the bank 126. The cathode electrode 180 may be formed conformally to the underlying features to reflect the level differences of the underlying features. The cathode electrode 180 may include a material layer having a small work function. Examples include Li, Ca, LiF/Ca, LiF/Al, Al, Mg, Ag, Pt, Pd, Ni, Au, Nd, Ir, Cr, BaF and Ba, or a compound or mixture thereof (e.g., a mixture of Ag and Mg). The cathode electrode 180 may further include a transparent metal oxide layer disposed on the material layer having a small work function.

A thin-film encapsulation layer 190 including a first inorganic layer 191, an organic layer 192 and a second inorganic layer 193 is disposed on the cathode electrode 180. Each of the first inorganic layer 191 and the second inorganic layer 193 may include an inorganic insulating material. The organic layer 192 may include an organic insulating material.

The touch layer TSL may be disposed on the thin-film encapsulation layer 190, and the base layer 205, the first touch insulating layer 215, the second touch conductive layer 220 and the second touch insulating layer 230 may be sequentially disposed. Redundant descriptions on the layers will be omitted. FIG. 8 is a cross-sectional view of the sensor portion, and therefore the first touch conductive layer 210 is not shown in the cross-sectional view.

The second touch conductive layer 220 may overlap with the pixel-defining layer 126 and may be disposed in the non-emission area NEM. The second touch conductive layer 220 forms the mesh pattern MSP of the sensor portions and does not interfere with emission of light and is not seen by a viewer because it does not overlap with the emission area EMA.

The anti-reflection layer RPL is disposed on the second touch insulating layer 230, and the protective layer WDL is disposed on the anti-reflection layer RPL. An adhesive layer OC may be further disposed between the anti-reflection layer RPL and the protective layer WDL. The anti-reflection layer RPL and the protective layer WDL may be bonded by the adhesive layer OC. The adhesive layer OC may be optically transparent. The adhesive layer OC may include, for example, a transparent adhesive member such as an optically clear adhesive (OCA) film and an optically clear resin (OCR).

When the anti-reflection layer RPL is implemented as a polarizing film, the low-refractive film LR, the anti-reflection layer RPL and the adhesive layer OC may include substantially the same refractive index. Thus, it is possible to suppress or prevent refraction or total reflection at the boundaries of the elements. As a result, light emission efficiency can be improved, and reflection of external light can be reduced.

Figure 11:
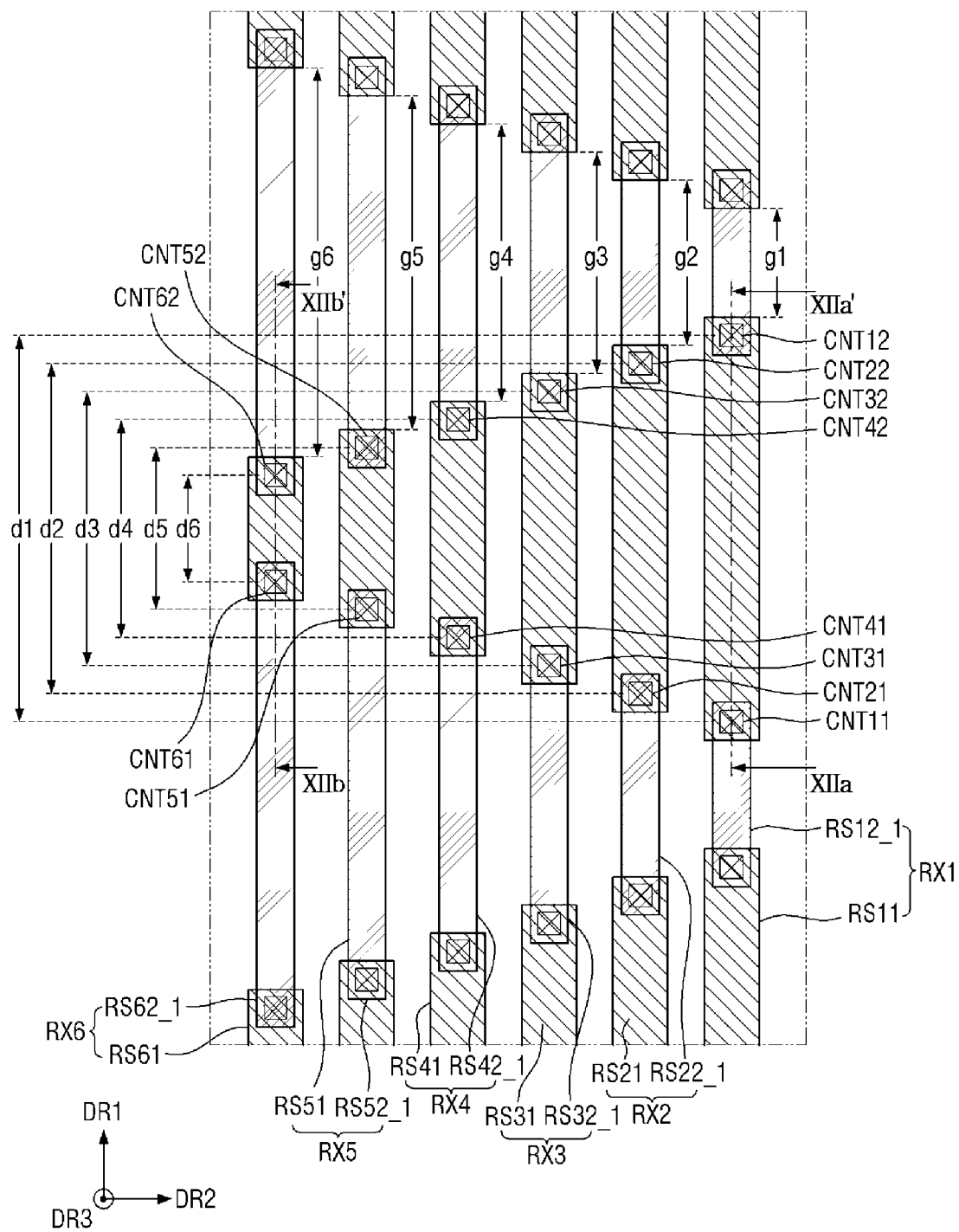
FIG. 11 illustrates an embodiment of touch sensing lines of a touch member.
Figure 12:
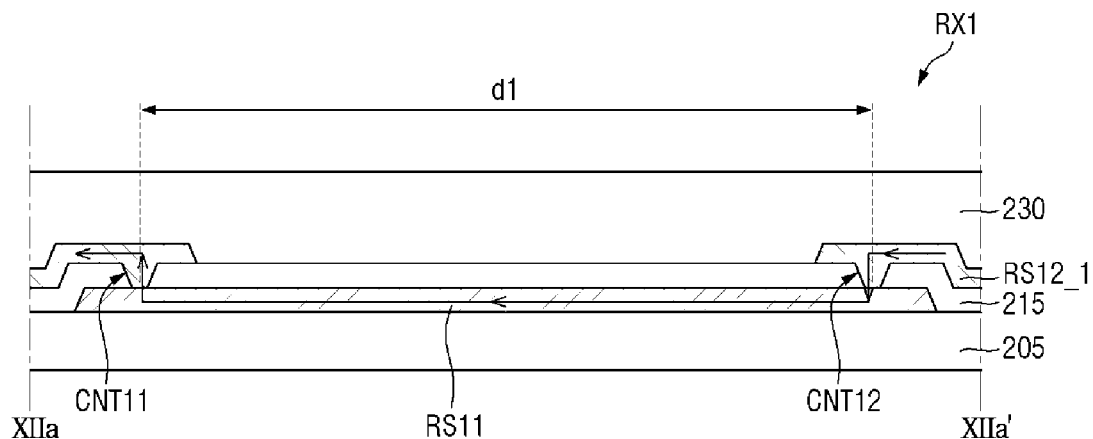
FIG. 12 illustrates a cross-sectional view taken along lines XIIa-XIIa' and XIIb-XIIb' of FIG. 11.
Figure 12:
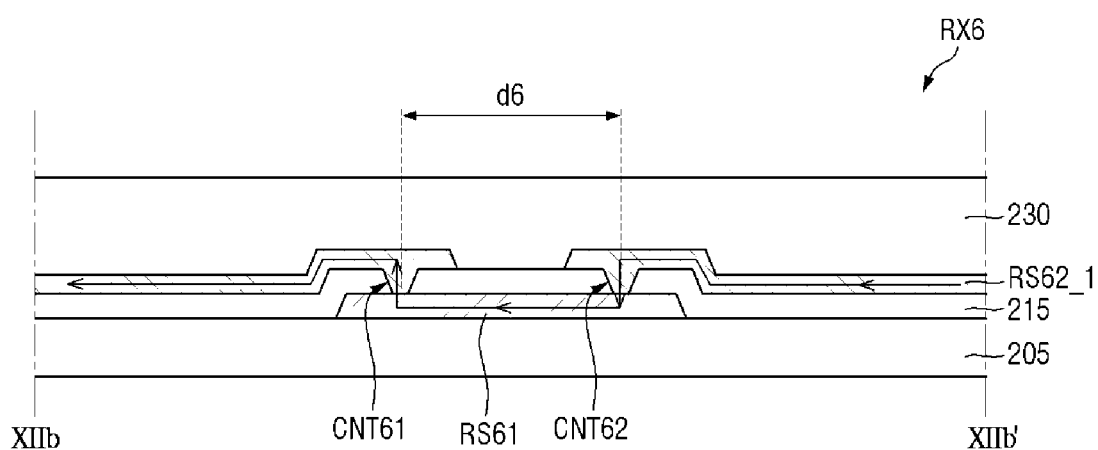
Figure 12:
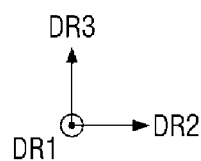

FIG. 11 is an enlarged view showing some of touch sensing lines of a touch member according to an embodiment, and FIG. 12 is a cross-sectional view taken along lines XIIa-XIIa' and XIIb-XIIb' of FIG. 11. The embodiment of FIGS. 11 and 12 is different from the embodiment of FIG. 7 in that each of first sub-touch sensing lines RS11, RS21, RS31, RS41, RS51 and RS61 as well as second sub-touch sensing lines RS12_1, RS22_1, RS32_1, RS42_1, RS52_1 and RS62_1 of a touch member is implemented as divided patterns.

According to this embodiment, touch sensing lines RX1, RX2, RX3, RX4, RX5 and RX6 of the touch member include the first sub-touch sensing lines RS11, RS21, RS31, RS41, RS51 and RS61 and the second sub-touch sensing lines RS12_1, RS22_1, RS32_1, RS42_1, RS52_1 and RS62_1. Each of the first sub-touch sensing lines RS11, RS21, RS31, RS41, RS51 and RS61 may be implemented as divided patterns, and each of the second sub-touch sensing lines RS12_1, RS22_1, RS32_1, RS42_1, RS52_1 and RS62_1 may be implemented as divided patterns.

The general shape of the second sub-touch sensing lines RS12_1, RS22_1, RS32_1, RS42_1, RS52_1 and RS62_1 may be substantially the same as the mirror image of the general shape of the first sub-touch sensing lines RS11, RS21, RS31, RS41, RS51 and RS61. For example, the general shape of the second sub-touch sensing lines RS12_1, RS22_1, RS32_1, RS42_1, RS52_1 and RS62_1 may be substantially the same as the general shape of the first sub-touch sensing lines RS11, RS21, RS31, RS41, RS51 and RS61 that is reversed horizontally (symmetrical in the first direction DR1) or vertically (symmetrical in the second direction DR2). It is, however, to be understood that the present disclosure is not limited thereto.

In one embodiment, the first sub-touch sensing lines RS11, RS21, RS31, RS41, RS51 and RS61 and the second sub-touch sensing lines RS12_1, RS22_1, RS32_1, RS42_1, RS52_1 and RS62_1 may be arranged alternately when viewed from the top. The first sub-touch sensing lines RS11, RS21, RS31, RS41, RS51 and RS61 and the second sub-touch sensing lines RS12_1, RS22_1, RS32_1 RS42_1, RS52_1 and RS62_1 of the touch sensing lines RX1, RX2, RX3, RX4, RX5 and RX6 may be connected in series, respectively. For example, the second sub-touch sensing lines RS12_1, RS22_1, RS32_1, RS42_1, RS52_1 and RS62_1 of the touch sensing lines RX1, RX2, RX3, RX4, RX5 and RX6 may be implemented as divided patterns spaced apart from one another and may be electrically connected with one another by the first sub-touch sensing lines RS11, RS21, RS31, RS41, RS51 and RS61. For example, the second sub-touch sensing lines RS12_1 of the first touch sensing line RX1 may be electrically connected with one another by the first sub-touch sensing lines RS11. The above description on the first touch sensing line RX1 can be equally applied to the second to sixth touch sensing lines RX2, RX3, RX4, RX5 and RX6.

The second sub-touch sensing lines RS12_1, RS22_1, RS32_1, RS42_1, RS52_1 and RS62_1 may have different lengths. For example, the lengths of the second sub-touch sensing lines RS12_1, RS22_1, RS32_1, RS42_1, RS52_1 and RS62_1 in the first direction DR1 may become shorter toward the first touch sensing line RX1 and may become longer toward the sixth touch sensing line RX6. It is, however, to be understood that the present disclosure is not limited thereto. In such case, the lengths of the first sub-touch sensing lines RS11, RS21, RS31, RS41, RS51 and RS61 in the first direction DR1 may become longer toward the first touch sensing line RX1 and may become shorter toward the sixth touch sensing line RX6.

When each of the second sub-touch sensing lines RS12_1, RS22_1, RS32_1, RS42_1, RS52_1 and RS62_1 of the touch sensing lines RX1, RX2, RX3, RX4, RX5 and RX6 is implemented as the divided patterns, the first sub-touch sensing lines RS11, RS21, RS31, RS41, RS51 and RS61 and the second sub-touch sensing lines RS12_1, RS22_1, RS32_1, RS42_1, RS52_1 and RS62_1 may have different conductivities (or electrical resistances).

According to this embodiment, the first sub-touch sensing lines RS11, RS21, RS31, RS41, RS51 and RS61 may have higher conductivities than the second sub-touch sensing lines RS12_1, RS22_1, RS32_1, RS42_1, RS52_1 and RS62_1. It is, however, to be understood that the present disclosure is not limited thereto. For example, the electrical resistances of the first sub-touch sensing lines RS11, RS21, RS31, RS41, RS51 and RS61 may be less than the electrical resistances of the second sub-touch sensing lines RS12, RS22, RS32, RS42, RS52 and RS62. In such case, by adjusting the length of each of the first sub-touch sensing lines RS11, RS21, RS31, RS41, RS51 and RS61 and the second sub-touch sensing lines RS12_1, RS22_1, RS32_1, RS42_1, RS52_1 and RS62_1 having different conductivities, it is possible to individually adjust the electrical resistance of each of the touch sensing lines RX1, RX2, RX3, RX4, RX5 and RX6.

When each of the touch sensing lines RX1, RX2, RX3, RX4, RX5 and RX6 includes the first sub-touch sensing lines RS11, RS21, RS31, RS41, RS51 and RS61 and the second sub-touch sensing lines RS12_1, RS22_1, RS32_1, RS42_1, RS52_1 and RS62_1 connected in series, the actual lengths of the touch sensing lines RX1, RX2, RX3, RX4, RX5 and RX6 may become longer toward the first touch sensing line RX1 and may become shorter toward the sixth touch sensing line RX6. In addition, the lengths of the first sub-touch sensing lines RS11, RS21, RS31, RS41, RS51 and RS61 may become longer toward the first touch sensing line RX1 and may become shorter toward the sixth touch sensing line RX6. The lengths of the second sub-touch sensing lines RS12_1, RS22_1, RS32_1, RS42_1, RS52_1 and RS62_1 may become shorter toward the first touch sensing line RX1 and may become longer toward the sixth touch sensing line RX6.

The electrical resistance of each of the touch sensing lines RX1, RX2, RX3, RX4, RX5 and RX6 may be calculated based on Equation 3, which represents an equation for calculating two resistors connected in series.

$$RX = R1 + R2 \quad (3)$$

where RX denotes the electrical resistance of each of the touch sensing lines RX1, RX2, RX3, RX4, RX5 and RX6, R1 denotes the electrical resistance of each of the first sub-touch sensing lines RS11, RS21, RS31, RS41, RS51 and RS61) of the touch sensing lines RX1, RX2, RX3, RX4, RX5 and RX6, and R2 denotes the electrical resistance of each of the second sub-touch sensing lines RS12_1, RS22_1, RS32_1, RS42_1, RS52_1 and RS62_1 of the touch sensing lines RX1, RX2, RX3, RX4, RX5 and RX6. For example, the electrical resistance of each of the touch sensing lines RX1, RX2, RX3, RX4, RX5 and RX6 may be equal to the sum of the electrical resistance of the respective first sub-touch sensing lines RS11, RS21, RS31, RS41, RS51 and RS61, and the electrical resistance of the respective second sub-touch sensing lines RS12_1, RS22_1, RS32_1, RS42_1, RS52_1 and RS62_1.

When the electrical resistances of the first sub-touch sensing lines RS11, RS21, RS31, RS41, RS51 and RS61 is less than the electrical resistances of the second sub-touch sensing lines RS12_1, RS22_1, RS32_1, RS42_1, RS52_1 and RS62_1, respectively, the electrical resistances of the touch sensing lines RX1, RX2, RX3, RX4, RX5 and RX6 may be substantially uniform. For example, even though the actual length of the first touch sensing line RX1 is longer than the actual length of the sixth touch sensing line RX6, the length of the first sub-touch sensing line RS11 of the first touch sensing line RX1 may be longer than the length of the first sub-touch sensing line RS61 of the sixth touch sensing line RX6, and the length of the second sub-touch sensing line RS12 of the first touch sensing line RX1 may be shorter than the length of the second sub-touch sensing line RS62 of the sixth touch sensing line RX6.

Therefore, the ratio of the first sub-touch sensing line RS11 having relatively low electrical resistance is high in the first touch sensing line RX1. The ratio of the first sub-touch sensing line RS61 having relatively low electrical resistance may be low in the sixth touch sensing line RX6, so that the electrical resistance of the first touch sensing line RX1 is substantially the same as the electrical resistance of the sixth touch sensing line RX6.

Also, in this case it is possible to individually adjust the electrical resistance of each of the touch sensing lines RX1, RX2, RX3, RX4, RX5 and RX6, and also is possible to uniformly adjust the electrical resistance of each of the touch sensing lines RX1, RX2, RX3, RX4, RX5 and RX6. As a result, the touch sensitivity of the touch member can become more uniform. In addition, it is possible to suppress or prevent defects due to particles or the like in the second sub-touch sensing lines RS12_1, RS22_1, RS32_1, RS42_1, RS52_1 and RS62_1.

In addition, as each of the second sub-touch sensing lines RS12_1, RS22_1, RS32_1, RS42_1, RS52_1 and RS62_1 is implemented as the divided patterns, it is possible to reduce the areas where the first sub-touch sensing lines RS11, RS21, RS31, RS41, RS51 and RS61 and the second sub-touch sensing lines RS12_1, RS22_1, RS32_1, RS42_1, RS52_1 and RS62_1 overlap each other in the thickness direction (the third direction DR3). Accordingly, it is possible to suppress or prevent defects such as a short-circuit possibly occurring between the first sub-touch sensing lines RS11, RS21, RS31, RS41, RS51 and RS61 and the second sub-touch sensing lines RS12_1, RS22_1, RS32_1, RS42_1, RS52_1 and RS62_1 due to particles. As a result, the yield of the process can be increased and reliability of the touch member can be improved.

Figure 13:
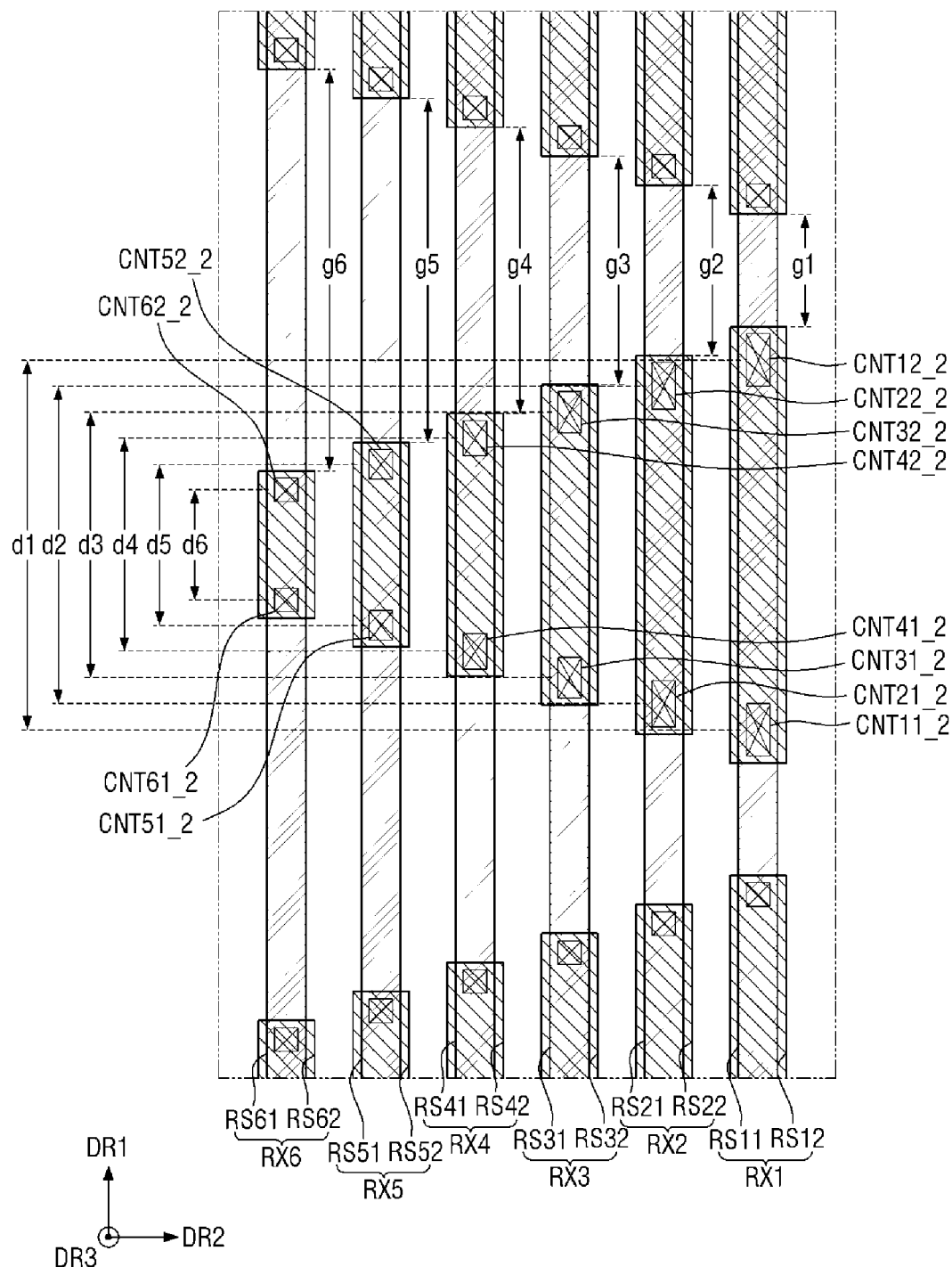
FIG. 13 illustrates an embodiment of touch sensing lines of a touch member.

FIG. 13 is an enlarged view showing some of touch sensing lines of a touch member according to yet an embodiment. The embodiment of FIG. 13 is different from the embodiment of FIG. 7 in that contact holes CNT11_2, CNT12_2, CNT21_2, CNT22_2, CNT31_2, CNT32_2, CNT41_2, CNT42_2, CNT51_2, and CNT52_2, CNT61_2 and CNT62_2 of the touch sensing lines RX1, RX2, RX3, RX4, RX5, RX6 have different sizes.

Referring to FIG. 13, the sizes of the contact hole CNT11_2, CNT12_2, CNT21_2, CNT22_2, CNT31_2, CNT32_2, CNT41_2, CNT42_2, CNT51_2, CNT52_2, CNT61_2 and CNT62_2 of the touch sensing lines RX1, RX2, RX3, RX4, RX5 and RX6 may increase toward the touch sensing line RX1 and may decrease toward the sixth touch sensing line RX6. It is, however, to be understood that the present disclosure is not limited thereto.

In this instance, the areas in which the first sub-touch sensing lines RS11, RS21, RS31, RS41, RS51 and RS61 and the second sub-touch sensing lines RS21, RS22, RS23, RS24, RS25 for RS26 are in direct contact with each other may decrease toward the first touch sensing line RX1 and may increase toward the sixth touch sensing line RX6. Accordingly, contact resistances at the areas in which the first sub-touch sensing lines RS11, RS21, RS31, RS41, RS51 and RS61 and the second sub-touch sensing lines RS21, RS22, RS23, RS24, RS25 for RS26 are in contact with each other may decrease toward the first touch sensing line RX1 and may increase toward the sixth touch sensing line RX6.

Thus, the longer the first sub-touch sensing lines RS11, RS21, RS31, RS41, RS51 and RS61 are, the larger the contact holes CNT11_2, CNT12_2, CNT21_2, CNT22_2, CNT31_2, CNT32_2, CNT41_2, CNT42_2, CNT51_2, CNT52_2, CNT61_2 and CNT62_2 are (in which they are in contact with the second sub-touch sensing lines RS21, RS22, RS23, RS24, RS25 and RS26, respectively) and the smaller the contact resistances are. Therefore, through the sizes of the contact holes CNT11_2, CNT12_2, CNT21_2, CNT22_2, CNT31_2, CNT32_2, CNT41_2, CNT42_2, CNT51_2, CNT52_2, CNT61_2 and CNT62_2, it is possible to individually adjust the overall electrical resistance of each of the touch sensing lines RX: RX1, RX2, RX3, RX4, RX5 and RX6.

Also in this instance, it is possible to individually adjust the electrical resistance of each of the touch sensing lines RX1, RX2, RX3, RX4, RX5 and RX6, and also is possible to uniformly adjust the electrical resistance of each of the touch sensing lines RX1, RX2, RX3, RX4, RX5 and RX6. As a result, the touch sensitivity of the touch member can become more uniform. Moreover, through the sizes of the contact holes CNT11_2, CNT12_2, CNT21_2, CNT22_2, CNT31_2, CNT32_2, CNT41_2, CNT42_2, CNT51_2, CNT52_2, CNT61_2 and CNT62_2, it is possible to individually adjust the overall electrical resistance of each of the touch sensing lines RX: RX1, RX2, RX3, RX4, RX5 and RX6, so that it can be easier to adjust the electrical resistance of each of the touch sensing lines RX1, RX2, RX3, RX4, RX5 and RX6.

Figure 14:
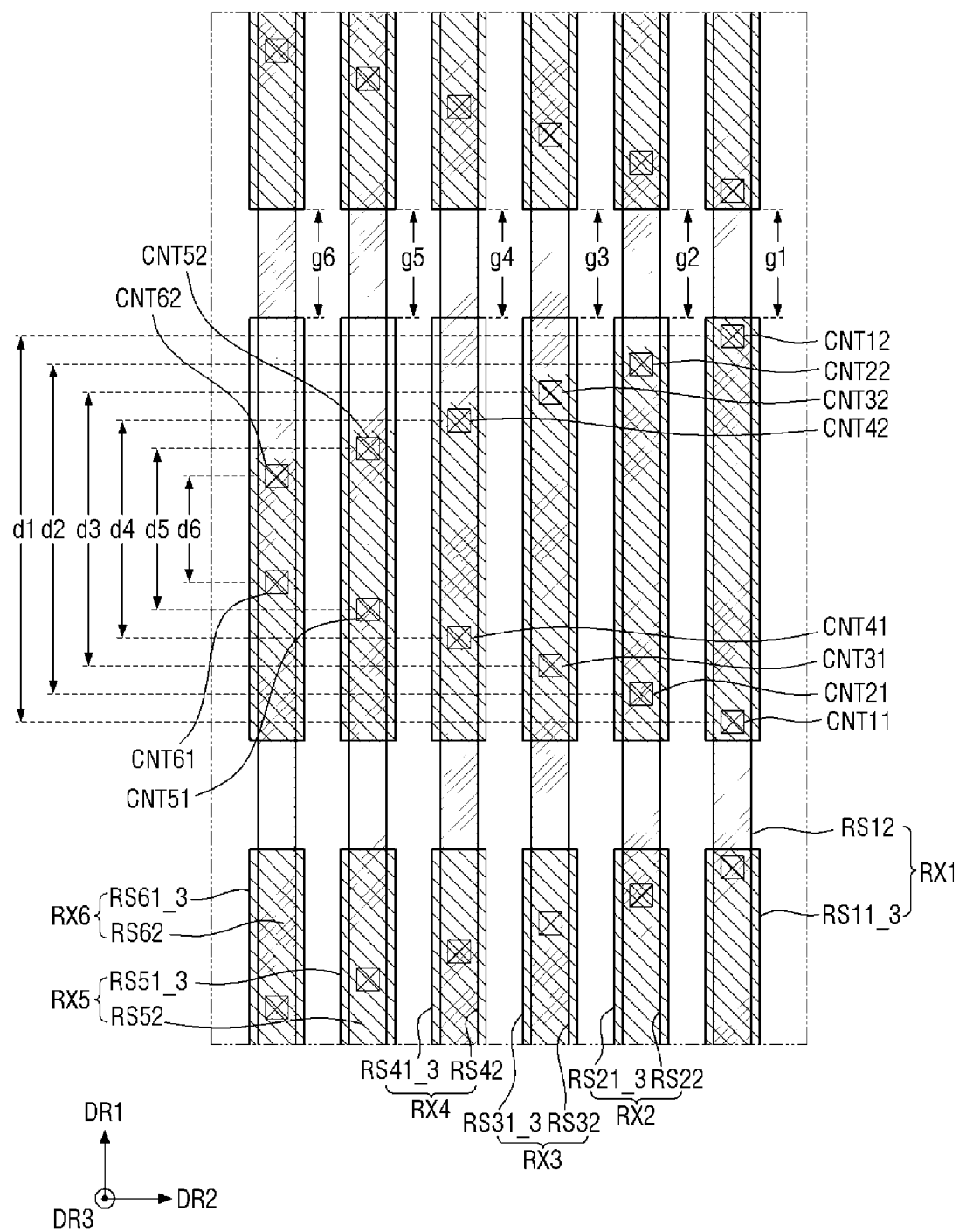
FIG. 14 illustrates an embodiment of touch sensing lines of a touch member.

FIG. 14 is an enlarged view showing some of touch sensing lines of a touch member according to an embodiment. The embodiment of FIG. 14 is different from the embodiment of FIG. 7 in that all or some of the first sub-touch sensing lines RS11_3, RS21_3, RS31_3, RS41_3, RS51_3 and RS61_3 of touch sensing lines RX1, RX2, RX3, RX4, RX5 and RX6 include substantially the same shape.

Even when the first sub-touch sensing lines RS11_3, RS21_3, RS31_3, RS41_3, RS51_3 and RS61_3 of the touch sensing lines RX1, RX2, RX3, RX4, RX5 and RX6 have substantially the same shape, the lengths by which the first sub-sensing lines RS11_3, RS21_3, RS31_3, RS41_3, RS51_3 and RS61_3 are electrically connected to the second sub-touch sensing lines RS21, RS22, RS23, RS24, RS25 and RS26, respectively, may be different from one another. The lengths d1, d2, d3, d4, d5 and d6 by which the first sub-touch sensing lines RS11_3, RS21_3, RS31_3, RS41_3, RS51_3 and RS61_3 are electrically connected to the second sub-touch sensing lines RS21, RS22, RS23, RS24, RS25 and RS26, respectively, may become longer toward the first touch sensing lines RX1 and may become shorter toward the sixth touch sensing line RX6.

In addition, the gaps g1, g2, g3, g4, g5 and g6 between the divided patterns of the second sub-touch sensing lines RS21, RS22, RS23, RS24, RS25 and RS26 may be substantially equal.

Also in this instance, it is possible to individually adjust the electrical resistance of each of the touch sensing lines RX1, RX2, RX3, RX4, RX5 and RX6, and also is possible to uniformly adjust the electrical resistance of each of the touch sensing lines RX1, RX2, RX3, RX4, RX5 and RX6. As a result, the touch sensitivity of the touch member can become more uniform.

Although described with reference to embodiments of the present disclosure, it will be understood that various changes and modifications of the present disclosure may be made by one ordinary skilled in the art or one having ordinary knowledge in the art without departing from the spirit and technical field of the present disclosure as hereinafter claimed. Hence, the technical scope of the present disclosure is not limited to the detailed descriptions in the specification but should be determined only with reference to the claims. The embodiments may be combined to form additional embodiments.

What is claimed is:

1. A display device, comprising:
  a display panel; and
  a touch member comprising a first conductive layer and a second conductive layer disposed on the display panel, and a touch insulating layer interposed between the first conductive layer and the second conductive layer, wherein the touch member comprises a first touch signal line and a second touch signal line separated from each other,
  the first touch signal line in a non-display area of the display panel comprising a first sub-touch signal line formed as the first conductive layer and a second sub-touch signal line formed as the second conductive layer and connected to the first sub-touch signal line through a first contact hole and a second contact hole penetrating the touch insulating layer, and wherein:
  the second touch signal line in the non-display area of the display panel comprises a third sub-touch signal line formed as the first conductive layer and a fourth sub-touch signal line formed as the second conductive layer and connected to the third sub-touch signal line through a third contact hole and a fourth contact hole penetrating the touch insulating layer,
  the first contact hole and the second contact hole are spaced apart from each other by a first distance, and
  the third contact hole and the fourth contact hole are spaced apart from each other by a second distance less than the first distance wherein the first sub-touch signal line includes a plurality of divided patterns, and the third sub-touch signal line includes a plurality of divided patterns.

2. The display device of claim 1, wherein the non-display area corresponds to a bezel area of the display device.

3. The display device of claim 1, wherein each of the second sub-touch signal line and the fourth sub-touch signal line is formed integrally as a single piece.

4. The display device of claim 3, wherein:
  each of the plurality of divided patterns of the first sub-touch signal line is connected in parallel to the second sub-touch signal line through a corresponding pair of a plurality of pairs of contact holes, one of the plurality of divided patterns connected to the second sub-touch signal line through the first contact hole and the second contact hole, and each of the plurality of divided patterns of the third sub-touch signal line is connected in parallel to the fourth sub-touch signal line through a corresponding pair of a plurality of pairs of contact holes, one of the plurality of divided patterns connected to the fourth sub-touch signal line through the third contact hole and the fourth contact hole.

5. The display device of claim 4, wherein the plurality of divided patterns of the first sub-touch signal line and the plurality of divided patterns of the third sub-touch signal line have substantially a same shape.

6. The display device of claim 1, wherein:
the second sub-touch signal line includes a plurality of divided patterns, and
the fourth sub-touch signal line includes a plurality of divided patterns.

7. The display device of claim 6, wherein:
the first sub-touch signal line and the second sub-touch signal line are connected in series, and
the third sub-touch signal line and the fourth sub-touch signal line are connected in series.

8. The display device of claim 7, wherein:
an electrical resistance of the first sub-touch signal line is less than an electrical resistance of the second sub-touch signal line, and
an electrical resistance of the third sub-touch signal line is less than an electrical resistance of the fourth sub-touch signal line.

9. The display device of claim 1, wherein:
the first touch signal line and the second touch signal line are extended in a first direction, and
the first touch signal line and the second touch signal line are spaced apart from each other in a second direction crossing the first direction.

10. The display device of claim 9, wherein:
the first touch signal line is extended in the first direction by a first length,
the second touch signal line is extended in the first direction by a second length, and
the first length is longer than the second length.

11. The display device of claim 10, wherein an electrical resistance of the first touch signal line is substantially equal to an electrical resistance of the second touch signal line.

12. The display device of claim 1, wherein a size of the first contact hole and a size of the second contact hole are larger than a size of the third contact hole and a size of the fourth contact hole.

13. The display device of claim 1, further comprising:
an active area corresponding to a display area in which images are displayed and touch input is sensed; and
a non-active area which corresponds to the non-display area and which is disposed on an outer side of the active area, wherein the first sub-touch signal line, the second sub-touch signal line, the third sub-touch signal line, and the fourth sub-touch signal line are disposed in the non-active area.

14. The display device of claim 1, wherein the first touch signal line and the second touch signal line are touch sensing lines.

15. The display device of claim 14, wherein:
the touch member comprises a plurality of touch driving electrodes extended in a first direction and a plurality of touch sensing electrodes extended in a second direction crossing the first direction, and
each of the first touch signal line and the second touch signal line is electrically connected to one of the plurality of touch sensing electrodes.

16. A display device, comprising:
a display panel; and
a touch member disposed on the display panel and comprising a first touch sensing line comprising a first sub-touch sensing line and a second sub-touch sensing line, and a second touch sensing line comprising a third sub-touch sensing line and a fourth sub-touch sensing line, the first touch sensing line and the second touch sensing line disposed in a non-display area of the display panel, wherein:
the first sub-touch sensing line and the second sub-touch sensing line are connected in parallel with each other through a first contact hole and a second contact hole,
the third sub-touch sensing line and the fourth sub-touch sensing line are connected in parallel with each other through a third contact hole and a fourth contact hole,
a length of the first touch sensing line is longer than a length of the second touch sensing line, and
a distance between the first contact hole and the second contact hole is greater than a distance between the third contact hole and the fourth contact hole, wherein:
each of the first sub-touch sensing line and the third sub-touch sensing line is implemented as a plurality of divided patterns, and
each of the second sub-touch signal line and the fourth sub-touch signal line is formed integrally as a single piece.

17. The display device of claim 16, wherein the touch member comprises a first conductive layer, a second conductive layer, and a touch insulating layer interposed between the first conductive layer and the second conductive layer, and wherein:
each of the first sub-touch sensing line and the third sub-touch sensing line corresponds to the first conductive layer,
each of the second sub-touch sensing line and the fourth sub-touch sensing line corresponds to the second conductive layer, and
the first contact hole, the second contact hole, the third contact hole and the fourth contact hole penetrate the touch insulating layer.

18. The display device of claim 17, wherein:
the first touch sensing line and the second touch sensing line are extended in a first direction, and
the first touch sensing line and the second touch sensing line are spaced apart from each other in a second direction crossing the first direction.

19. The display device of claim 16, wherein the non-display area corresponds to a bezel area of the display device.

20. The display device of claim 19, wherein an electrical resistance of the first touch sensing line is substantially equal to an electrical resistance of the second touch sensing line.

* * * * *